United States Patent
Izumi et al.

(10) Patent No.: US 6,236,446 B1
(45) Date of Patent: *May 22, 2001

(54) METHODS FOR CUTTING ELECTRIC CIRCUIT CARRYING SUBSTRATES AND FOR USING CUT SUBSTRATES IN DISPLAY PANEL FABRICATION

(75) Inventors: Yoshihiro Izumi; Yoshinori Harada, both of Kashihara (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/160,787

(22) Filed: Sep. 24, 1998

(30) Foreign Application Priority Data

Sep. 25, 1997 (JP) .................................................... 9-260597
Jun. 1, 1998 (JP) .................................................. 10-151784

(51) Int. Cl.[7] ........................................................ G02F 1/13
(52) U.S. Cl. ........................ 349/187; 349/158; 225/93.5; 219/121.67
(58) Field of Search .......................... 349/187; 225/93.5; 219/121.67

(56) References Cited

U.S. PATENT DOCUMENTS

| | | | |
|---|---|---|---|
| 3,970,819 | * | 7/1976 | Gates et al. ........................... 219/121 |
| 5,138,131 | * | 8/1992 | Nishikawa et al. ............. 219/121.67 |
| 5,269,868 | * | 12/1993 | Gofuku et al. ....................... 156/344 |
| 5,609,284 | * | 3/1997 | Kondratenko ............................ 225/1 |
| 5,984,159 | * | 2/2000 | Ostedarp et al. ................... 225/93.5 |
| 6,023,039 | * | 2/2000 | Sawada ........................... 219/121.61 |

FOREIGN PATENT DOCUMENTS 60-191029   12/1985   (JP) .
8-78986     3/1996    (JP) .

OTHER PUBLICATIONS

"Cleavage–Cutting of Brittle Materials by Laser Heating" in Journal of the Japan Society for Precision Engineering, T. Okiyama, vol. 60, No. 2, pp. 196–199, 1994.

* cited by examiner

*Primary Examiner*—Kenneth Parker

(57) ABSTRACT

A method for cutting a circuit substrate which includes a substrate with an upper surface and a lower surface and electric circuitry provided on the upper surface of the substrate, includes the steps of: irradiating a laser beam onto the lower surface of the substrate so that a stress is generated inside the substrate using an irradiated spot of the laser beam as a heat source; and cutting the substrate by moving the irradiated spot.

18 Claims, 14 Drawing Sheets

(1) Diamond scribing method (2) Laser scribing method (3) Diamond blade dicing method (4) Laser cleavage-cutting method

METHODS FOR CUTTING ELECTRIC CIRCUIT CARRYING SUBSTRATES AND FOR USING CUT SUBSTRATES IN DISPLAY PANEL FABRICATION

BACKGROUND OF THE INVENTION

1. Field of the Invention

The present invention relates to a method for fabricating a display panel used in a monitor for an audiovisual apparatus such as a television set, an office automation apparatus, or the like; and a method for cutting a substrate which can be preferably used in the method for fabricating a display panel.

2. Description of the Related Art

In recent years, liquid crystal display devices (hereinafter, referred to as "LCDs") have been used in various fields. Advantages for using an LCD over other conventional display devices include their light weight due in part to their recent significant size reduction in a depth direction, i.e., realization of an extremely thin thickness; their ability to be easily installed in a small space; their low power consumption; and their ability to readily realize a full-color display. The LCD generally includes a liquid crystal display panel, a driving circuit, a backlight, and the like.

During a process for fabricating a liquid crystal display panel, a step of cutting a mother substrate, on which electrical lines are formed by a known process, into a predetermined size is needed irrespective of the type of the liquid crystal display panel. For example, in a liquid crystal display panel having electrical lines provided in a X-Y matrix shape, all of the electrical lines are short-circuited up to some point in the process for fabricating the liquid crystal display panel in order to avoid defects caused by static electricity. Therefore, in order to insulate individual electrical lines from each other, a step for cutting a substrate is also needed.

In accordance with known LCD fabricating process, there are generally two different times when such substrate cutting steps are performed: (i) after fabricating a panel by attaching together a pair of mother substrates with electrical lines provided thereon, the substrate is cut to a predetermined size; and (ii) after a pair of mother substrates.with electrical lines provided thereon are cut to a predetermined size, respectively, the thus-obtained substrates are attached to each other to produce a panel.

Known methods for cutting a substrate includes: (1) a diamond scribing method as shown in FIG. 10A, (2) a laser scribing method as shown in FIG. 10B, (3) a diamond blade dicing method as shown in FIG. 10C, and (4) a laser cleavage-cutting method as shown in FIG. 10D. Particularly in the fabrication of a liquid crystal display panel, the diamond scribing method shown in FIG. 10A is often employed from the standpoint of productivity.

Along with the onset of the information age, display devices used as a monitor for audiovisual apparatus such as a television set, an office automation apparatus, or the like came have been required to have high definition and a large screen. In order to provide a large screen in display devices such as a cathode ray tube (CRT) based display, a LCD, a plasma display, an electro luminescence display (hereinafter, referred to as an "EL display"), or a light-emitting diode (LED) display, developments have been made and display devices having such large screens have been put into practice. At the same time, since realization of such a large screen has lead to increases in weight, size, and power consumption of the display device, it has been ongoing challenge to reduce the weight and thickness of the display device, and to realize a lower power consumption in the display device.

Among the display devices described above, the LCD can satisfy the aforementioned needs since the LCD is lightweight due in part to its significantly thin size which also allows it to be installed in a small space. In addition, the LCD can satisfy the aforementioned needs due to its low power consumption while still being able to readily realize a full-color display device. Moreover, the LCD is suitable for use in a display device with a large screen such as a large size monitor, a wall-mounted display device, or the like. Therefore, as to the realization of a large screen, a greater expectation is placed on the LCD as compared to the other display devices.

When the screen size of a liquid crystal display panel is increased, however, a defect rate rapidly increases due to the breakage of signal lines, pixel defects, and the like in the process of fabricating the liquid crystal display panel. In addition, the price of the liquid crystal display panel also increases. Therefore, in order to solve these problems, Japanese Laid-open Utility Model Publication No. 60-191029, for example, discloses a liquid crystal display panel composed of one large substrate which is fabricated by connecting a plurality of small substrates along their side surfaces so as to compose at least one of a pair of substrates constituting the liquid crystal display panel.

FIG. 11A is a plan view showing the liquid crystal display panel disclosed in Japanese Laid-open Utility Model Publication No. 60-191029. FIG. 11B shows a cross-sectional view showing the liquid crystal display panel cut along line I—I in FIG. 11A. Herein, four active matrix substrates are connected in the manner shown in FIG. 11A (two substrates in a row×two substrates in a column) so as to make a large substrate. A liquid crystal display panel with a large screen is fabricated by attaching the thus-obtained large substrate with other appropriate substrates (i.e., a color filter substrate) having a liquid crystal layer interposed therebetween.

In an active matrix type liquid crystal display panel, it is, in general, extremely difficult to fabricate a large substrate on which a micro-active element may be provided in each pixel (i.e., an active matrix substrate) while still allowing for a high yield of LCD displays. Therefore, in terms of productivity, the fabrication process which will now be described is considered to be more effective.

More particularly, in this fabrication process, a plurality of small substrates are fabricated and connected with one another at the side surfaces thereof to make a large active matrix substrate. Thereafter, a large substrate (i.e., a counter substrate) with a color filter provided thereon is attached to the active matrix substrate so as to fabricate a panel.

According to such a liquid crystal display panel with a large screen, in order to make stitching between substrates less noticeable, it is necessary to make a connecting region between the substrates as small as possible by accurately cutting a connecting surface between the active matrix substrates. Therefore, in fabricating such a liquid crystal display panel, from the standpoint of processing accuracy, the diamond blade dicing method is often employed in order to accurately cut the connecting surface.

According to the diamond scribing method as depicted in FIG. 10A, among the aforementioned methods for cutting a substrate, a cutting projected line is marked off using a diamond needle, and a substrate is divided by applying a mechanical bending stress. With this method, it is possible to easily perform a cutting process. Therefore, the use of the diamond scribing method allows for a high rate of manufacture. However, the diamond scribing method has problems such as the creation of small particle like chips resulting from breaking the substrate (hereinafter, referred to as "broken chips"), poor alignment accuracy of about several hundreds micrometers, and the like.

According to the laser scribing method as described in FIG. 10B, after the surface of a material is melted and evaporated by irradiating a cutting projected line with a laser beam so as to form a slot, the substrate is cut by applying a mechanical bending stress thereto. Although the laser scribing method can realize a non-contact and high-speed processing, there exist problems such as the scattering of the melted and evaporated substrate as particles, thereby adhering to the surface of the substrate, the generation of broken chips, and the like.

According to the diamond blade dicing method as depicted in FIG. 10C, a grinding processing is performed by high speed rotation of a blade to which abrasive diamond grains are adhered and applying the rotating blade to the substrate. The diamond blade dicing method produces excellent processing accuracy. However, this method requires water for grinding and washing, and has problems such as the generation of grinding chips, and the like.

The laser cleavage-cutting method as depicted in FIG. 10D utilizes a thermal stress which is generated inside the material when irradiated with a laser beam. By moving such a heat source, cleavage develops. The laser cleavage-cutting method does not generate broken chips, particles, grinding chips, or the like, and requires no water for grinding or washing. Recently, the laser cleavage-cutting method has been applied for the cutting of various types of substrates. For example, JOURNAL OF THE JAPAN SOCIETY FOR PRECISION ENGINEERING (p. 196, Vol. 60, No. 2, 1994) briefly describes such an application.

In the case where the laser cleavage-cutting method is used for cutting a substrate for a liquid crystal display panel, however, problems as described hereinafter will arise.

Electrical lines, insulation film, and the like often exist along a cutting line of a substrate for a general liquid crystal display panel. For example, in the case of a passive matrix type liquid crystal display panel, electrical lines formed of transparent conductive films exist along a cutting line. In the case of the active-matrix type liquid crystal display device, on the other hand, electrical lines formed of metal films, insulation film, and the like exist on a cutting line. This is because of the fabrication process described above in which during the forming of these electrical lines on a mother substrate, all electrical lines are short-circuited in the peripheral region of the substrate in order to avoid defects caused by static electricity, and each electrical line is isolated from each other by cutting off the peripheral region in the step for cutting the substrate. However, in the case where the laser cleavage-cutting method is used on a substrate having such electrical lines, insulation film, and the like, a laser beam may be reflected depending on the existence of the electrical lines, and the amount of absorption of a laser beam varies depending on the existence of insulation film. As a result, a thermal stress which is generated when irradiated with a laser beam fluctuates, thereby not being able to smoothly cut the substrate with high accuracy.

Moreover, in the case where the laser cleavage-cutting method is used for cutting the connecting surface between the active matrix substrates for the aforementioned liquid crystal display panel with a large screen, problems as described below will arise.

Upon cutting such an active matrix substrate, it is necessary to perform cutting in the vicinity of a display pixel in a highly accurate manner in order to make the stitching between the substrates less noticeable by making the connecting region as small as possible. For such a purpose, it is required to dispose a pixel electrode, a semiconductor element (for example, a thin-film transistor (hereinafter, referred to as a "TFT")), and the like at positions about 100 $\mu$m to about 500 $\mu$m away from the edge of the connecting surface, although the distance varies depending on the size of the liquid crystal display panel with a large screen and the resolution thereof.

Since the aforementioned laser cleavage-cutting method is a method utilizing a thermal stress which is generated when irradiated laser beam is absorbed in the vicinity of the surface of the substrate, the vicinity of the laser irradiated spot is more likely to be affected by heat conduction. As a result, any semiconductor element (i.e., TFT), which is disposed in a position close to the connecting surface is heated and adverse effects such as a change in characteristics are thus generated. Moreover, when a semiconductor element (i.e., TFT) is directly irradiated with a laser beam, adverse effects such as optical deterioration may occur.

SUMMARY OF THE INVENTION

According to one aspect of this invention, a method for cutting a circuit substrate which includes a substrate with an upper surface and a lower surface and electric circuitry provided on the upper surface of the substrate, includes the steps of: irradiating a laser beam onto the lower surface of the substrate so that a stress is generated inside the substrate using an irradiated spot of the laser beam as a heat source; and cutting the substrate by moving the irradiated spot.

According to another aspect of this invention, a method for fabricating a display panel including a first circuit substrate and a second circuit substrate, each of the first and the second circuit substrates having a substrate with an upper surface and a lower surface and electric circuitry provided on the upper surface of the substrate, includes the steps of forming the first circuit substrate by cutting a mother circuit-substrate having a mother substrate with an upper surface and a lower surface and electric circuitry provided on the upper surface of the mother substrate. The step of forming the first circuit substrate includes the steps of: irradiating a laser beam onto the lower surface of the mother substrate so that a stress is generated inside the mother substrate using an irradiated spot of the laser beam as a heat source; and cutting the mother substrate by moving the irradiated spot.

In one embodiment of the present invention, in the step of cutting the mother substrate, the mother substrate is cut so that the first circuit substrate has a curved corner.

In another embodiment of the present invention, in the step of cutting the mother substrate, the mother substrate is cut so that the first circuit substrate has a corner with a radius of curvature of about 2 mm or more.

According to still another aspect of this invention, a method for fabricating a display panel having a large circuit substrate obtained by connecting a plurality of first circuit substrates and a second circuit substrate provided so as to face the large circuit substrate each of the plurality of first circuit substrates and the second circuit substrate having a substrate with an upper surface and a lower surface and electric circuitry provided on the upper surface of the substrate, includes the steps of: forming the plurality of first circuit substrates by cutting a mother circuit-substrate having a mother substrate with an upper surface and a lower surface and electric circuitry provided on the upper surface of the mother substrate; forming the large circuit substrate by connecting the cut surfaces of the plurality of first circuit substrates with each other; and attaching the large circuit substrate to the second circuit substrate. The step of forming the first circuit substrate includes the steps of: irradiating a laser beam onto the lower surface of the mother substrate so that a stress is generated inside the mother substrate using an irradiated spot of the laser beam as a heat source; and cutting the mother substrate by moving the irradiated spot.

According to still yet another aspect of this invention, a method for fabricating a display panel including a first circuit substrate and a second circuit substrate, each of the first and the second circuit substrates having a substrate with an upper surface and a lower surface and electric circuitry provided on the upper surface of the substrate, includes the steps of: attaching the first circuit substrate to the second circuit substrate so that the upper surface of the first circuit substrate faces the upper surface of the second circuit substrate; irradiating a laser beam onto the lower surface of each of the substrates of the first and the second circuit substrates after the step of attaching the first and the second circuit substrates with each other so that a stress is generated inside the substrate using irradiated spot of the laser beam as a heat source; and cutting each of the substrates of the first and the second circuit substrates by moving the irradiated spot so as to form the display panel.

In one embodiment of the present invention, in the step of cutting each of the substrates of the first and the second circuit substrates, the substrates are cut so that each of the first and the second circuit substrates has a curved corner.

In another aspect of the present invention, in the step of cutting each of the substrates of the first and the second circuit substrates, the substrates are cut so that each of the first and the second circuit substrates has a corner with a radius of curvature of about 2 mm or more.

In still yet another aspect of this invention, a method for fabricating a display panel having a plurality of subpanels, each of the plurality of subpanels having a first circuit substrate and a second circuit substrate, each of the first and the second circuit substrates having a substrate with an upper surface and a lower surface and electric circuitry provided on the upper surface of the substrate, includes the steps of: attaching the first circuit substrate to the second circuit substrate so that the upper surface of the first circuit substrate faces the upper surface of the second circuit substrate; irradiating a laser beam onto the lower surface of each of the substrates of the first and the second circuit substrates after the step of attaching the first and the second circuit substrates with each other so that a stress is generated inside the substrate using an irradiated spot of the laser beam as a heat source; cutting each of the substrates of the first and the second circuit substrates by moving the irradiated spot so as to form at least one of the subpanels; and connecting the cut surfaces of the substrates of the subpanels with each other so as to form the display panel.

According to the present invention, a laser beam is applied to the surface opposite to the surface on which electric circuitry such as electrical lines, insulation film, and semiconductor elements are provided. (Hereinafter, the surface on which the electric circuitry such as electrical lines, insulation film, and semiconductor elements are provided is referred to as an "upper surface", and the surface opposite to the upper surface is referred to as a "lower surface".) As a result, a thermal stress resulting from the irradiated spot functioning as a heat source is generated inside the substrate, and the substrate is cut by moving the irradiated spot so as to develop cleavage. Since a laser beam is applied to the lower surface of the substrate, i.e., the surface opposite to the surface on which electric circuitry is provided, laser beam reflection caused by the presence of electrical lines does not occur, and a variation in the absorptivity of a laser beam caused by the presence of the insulation film is not created. Therefore, variation in a thermal stress which is generated when irradiated with a laser beam does not occur. As a result, it is possible to smoothly cut the substrate with high accuracy. It is also possible to obtain a mirror-finished cut surface having no microcracks.

According to the present invention, upon fabricating a display panel in which a pair of substrates each having electric circuitry such as electrical lines, insulation film, and semiconductor elements provided on the upper surface thereof are attached to each other, a laser beam is irradiated to a corresponding lower surface of at least one of the substrates which is opposite to the surface on which electric circuitry such as electrical lines, insulation film, and semiconductor elements is provided. As a result, a thermal stress which is generated when irradiated with a laser beam is not varied. Thus, it is possible to cut the substrate smoothly and in an accurate manner. Moreover, since a laser beam is applied to the lower surface which is opposite to the surface on which semiconductor elements (TFTs or the like) are provided, adverse effects such as optical deterioration and heat conduction are less likely to occur. As a result, problems such as a characteristics change in the semiconductor element do not occur. Furthermore, steps such as a chambering step for removing microcrack or burr at the edge and a washing step for removing broken chips, particles, grinding chips, and the like, which are required in the conventional method for fabricating a display panel, can be omitted after the cutting step. As a result, the process for fabricating a display panel can be simplified. When the active matrix substrate is cut, since the semiconductor elements such as TFTs are exposed on the surface of the substrate, close attention also needs to be paid to the possibility of chemical contamination from the external laser source, adhering of broken chips, particles, ground chips, and the like, which are generated upon cutting the substrate, and resulting in a flaw on the surface of the substrate, etc. Since the present invention can avoid such chemical contamination and adhering of broken chips, particles, ground chips, and the like, a product defect ratio can be improved. Furthermore, since it is possible to cut a substrate without contacting the substrate, automation of the device can be easily realized. Thus, the present invention is superior in terms of productivity.

According to the present invention, in the method for fabricating a display panel by which a large screen can be realized by fabricating a large substrate obtained by connecting a plurality of small substrates along their side surfaces with a counter substrate via a liquid crystal layer interposed therebetween, a laser beam is applied to a corresponding lower surface of the large substrate for fabricating the small substrates, the lower surface being opposite to the upper surface on which electric circuitry such as the electrical lines, the insulation film, and the semiconductor elements is provided. As a result, a thermal stress which is generated when irradiated with a laser beam is prevented from fluctuating. Thus, it is possible to cut the substrate smoothly and with high accuracy. Moreover, since a laser beam is applied to the surface opposite to the surface on which semiconductor elements (TFTs or the like) are provided, adverse effects such as optical deterioration and heat conduction are less likely to occur. As a result, problems such as a characteristics change in the semiconductor element do not occur. Furthermore, since it is possible to obtain a mirror-finished cut surface having no microcracks, the wettability of an adhesive is improved when cut surfaces are connected to each other with such an adhesive, thereby improving the bonding strength. In addition, it is possible to eliminate the scattering of light at the interface between the adhesive and cut surface.

According to the present invention, for the panel constituting section where a pair of substrates each having electric circuitry provided on the upper surface thereof are attached to each other, a laser beam is applied to the lower surface of each of the substrates, which is opposite to the surface on which the electric circuitry is provided. As a result, a thermal stress which is generated when irradiated with a laser beam is prevented from fluctuating. Thus, it is possible to smoothly cut one or more display panels in a predetermined mined size with high accuracy. Moreover, since a laser beam is applied to the surface opposite to the surface on which semiconductor elements (TFTs or the like) are provided, adverse effects such as optical deterioration and heat conduction are less likely to occur. As a result, problems such as a characteristics change in the semiconductor element do not occur.

According to the present invention, upon fabricating a large display panel by connecting a plurality of small panels at the side surfaces thereof, for the panel constituting section where a pair of substrates each having electric circuitry provided on the upper surface thereof are attached to each other, a laser beam is applied to the lower surface of each of the substrates, which is opposite to the surface on which the electric circuitry is provided. As a result, a thermal stress, which is generated when irradiated with a laser beam is prevented from fluctuating. Thus, it is possible to smoothly obtain a small panel of a predetermined size and in an accurate manner. Moreover, since a laser beam is applied to the lower surface which is opposite to the surface on which semiconductor elements (TFTs or the like) are provided, adverse effects such as optical deterioration and heat conduction are less likely to occur. As a result, problems such as a characteristics change in the semiconductor element do not occur. Furthermore, since it is possible to obtain a mirror-like finished cut surface having no microcracks, wettability of an adhesive is improved when the cut surfaces are connected to each other with such an adhesive, thereby improving the bonding strength. In addition, it is possible to eliminate the scattering of light at the interface between the adhesive and cut surface.

According to the present invention, the corner area of the substrate or the display panel is cut so as to have a curved shape. As a result, chipping is less likely to occur in the corner area of the substrate for the display panel. Thus, it is possible to prevent the generation of broken chips resulting from chipping of the corner area. Thus, defects such as the adhering of the broken chips to the surface of the substrate do not occur, thereby improving a product defect ratio. Moreover, even when an operator's hand touches the cut substrate or display panel, since the corner area thereof does not have a sharp edge, operational safety can be improved.

According to the present invention, the corner area of the substrate or the display panel is cut so as to have a curved shape with a radius of curvature of about 2 mm or greater. As a result, as will be described later in Example 3 of the present invention, it is possible to perform cutting as intended without overshooting the cutting projected line.

According to the present invention, when fabricating one display panel, the panel constituting section has substantially the same size as that of the display panel. By cutting the edge portions of the panel constituting section, the display panel can be obtained. In the case where two or more display panels are fabricated, the panel constituting section has a size just sufficient enough to cover two or more display panels.

Thus, the invention described herein makes possible the advantages of (1) providing a method for cutting a substrate which is capable of cutting a substrate including electric circuitry such as electrical lines, insulation film, semiconductor elements, and the like provided thereon with excellent processing accuracy and capable of preventing adverse effects such as a characteristics change and optical deterioration in the semiconductor element; and (2) providing a method for fabricating a display panel using the same substrate cutting method.

These and other advantages of the present invention will become apparent to those skilled in the art upon reading and understanding the following detailed description with reference to the accompanying figures.

BRIEF DESCRIPTION OF THE DRAWINGS

FIG. 3A-1 is a view showing the result of measuring the face roughness on the cut surface of the substrate according to Example 1 of the present invention;

FIG. 3A-2 is a view showing the three-dimensional representation for the shape of the cut surface of e substrate according to Example 1 of the present invention;

FIG. 3B-1 is a view showing the result of measuring the surface roughness of the cut surface of a substrate cut by diamond blade dicing method;

FIG. 3B-2 is a view showing the three-dimensional representation for the shape of the cut surface of the substrate cut by the diamond blade dicing method;

DESCRIPTION OF THE PREFERRED EMBODIMENTS

Hereinafter, the present invention will be described by way of illustrative, but non-limiting examples with reference to the accompanying drawings. Although a method for fabricating a liquid crystal display panel using liquid crystal as a display medium will be described in the following examples, the present invention is not limited thereto. For example, the present invention is applicable as a method for fabricating another display panel such as a plasma display panel (PDP), EL display panel, or the like.

EXAMPLE 1

Figure 1:
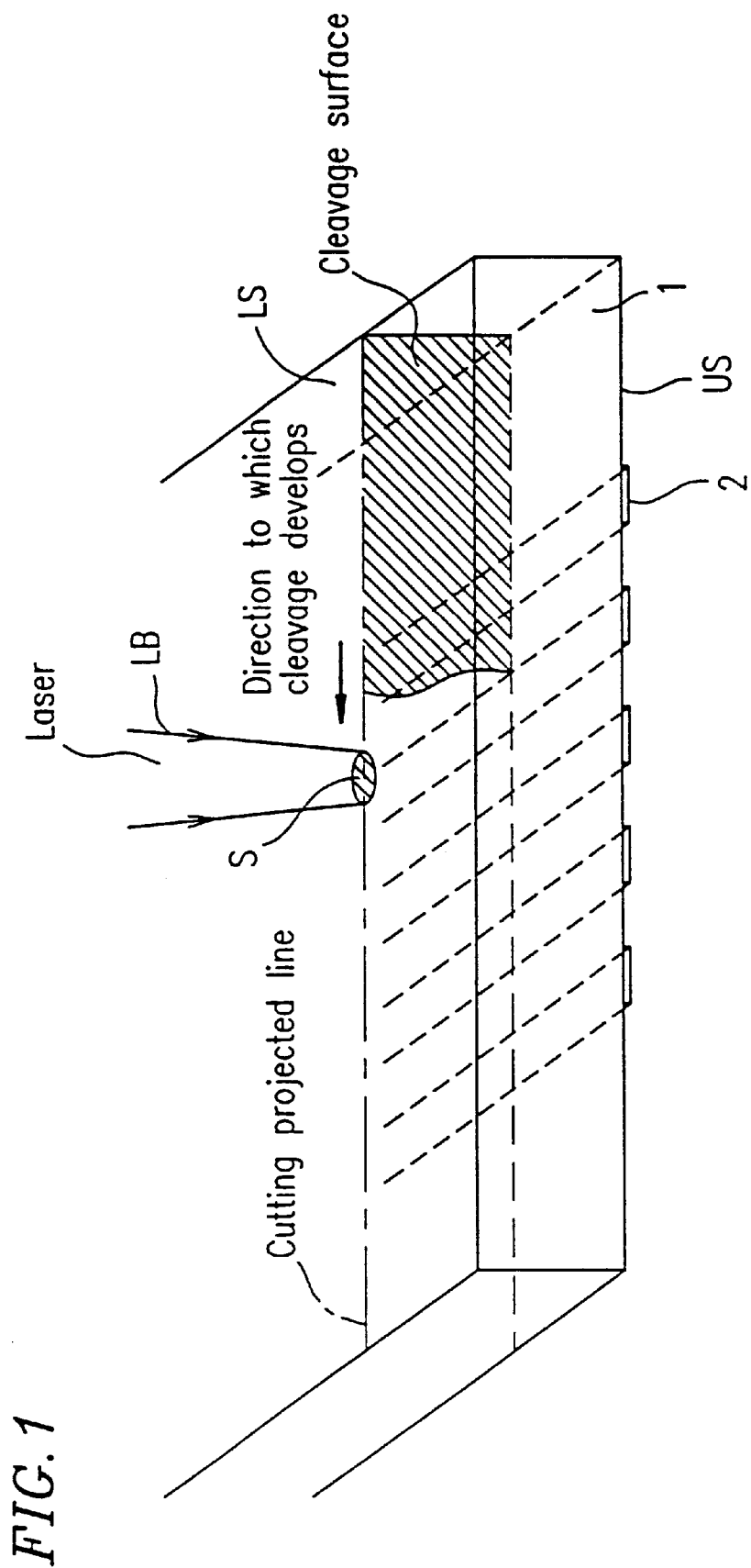
FIG. 1 is a perspective view for describing a method for cutting a substrate according to Example 1 of the present invention.

FIG. 1 is a perspective view illustrating a method for cutting a substrate according to Example 1 of the present invention. In Example 1, in order to cut an active matrix substrate of a liquid crystal display panel to a predetermined size, cutting is performed along electrical lines used for connecting terminals in the periphery of the display section.

A no-alkali glass suitable for use in a liquid crystal display panel, which has a thickness of about 1.1 mm, (#7059, produced by Coning) is used as a substrate 1. Metal lines deposited by sputtering method are used as electrical lines 2. According to the present example, the electrical lines 2 are formed by depositing a Ta film with a thickness of about 0.3 μm by the sputtering method and patterning the Ta film.

According to Example 1 of the present invention, the substrate 1 is cut by irradiating the cutting projected line on the substrate 1 with a laser beam LB. Such a cutting utilizes a thermal stress which is generated inside the material when irradiated with a laser beam, i.e., a compressive stress and a tensile stress which are generated in the vicinity of a heat source. The substrate 1 is cut by moving the heat source, i.e., the irradiated spot S so as to develop cleavage. The laser beam LB is applied to a surface opposite to a surface on which the electrical lines 2 are provided. (Hereinafter, the surface on which electric circuitry such as an electrical line 2 or at least one electrode is provided is referred to as an "upper surface" US, and the surface opposite to the upper surface is referred to as a "lower surface" LS.) As shown in FIG. 1, the substrate 1 with the electrical lines 2 provided thereon is disposed so that the upper surface thereof faces down. The laser beam is applied along the cutting projected line on the lower surface of the substrate 1. In accordance with the movement of the laser beam LB, the irradiated spot S is moved so as to develop cleavage. The temperature of the irradiated spot S serving as a heat source is set to be a temperature equal to or lower than the melting point of the material of the substrate 1, which in the present example is glass, so as to prevent the surface shape from changing due to the melting.

Figure 2:
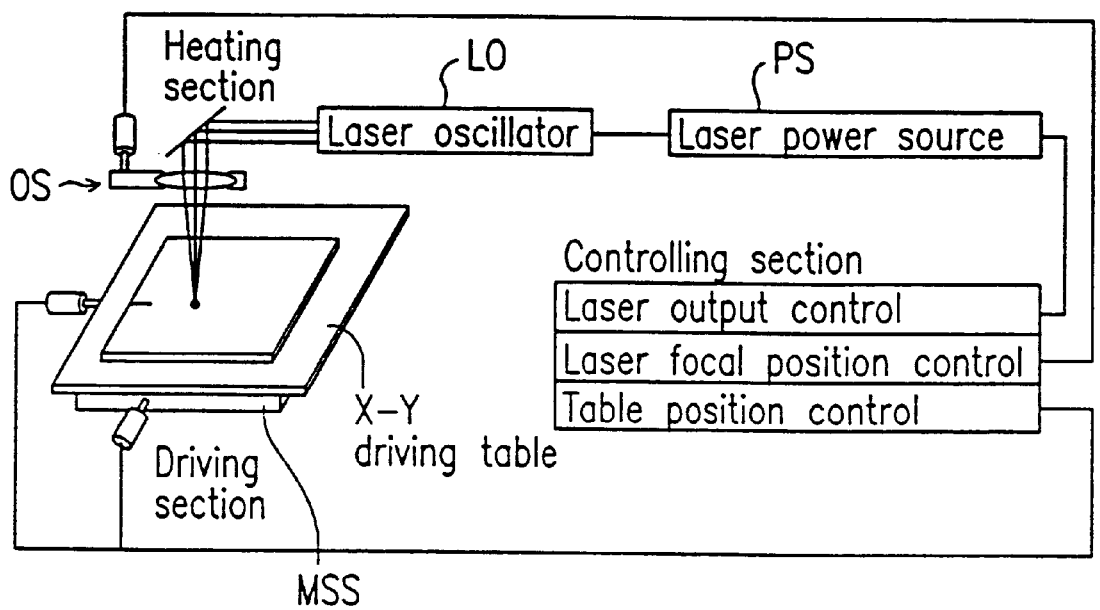
FIG. 2 is a general schematic view illustrating a device used or cutting a substrate in the present invention.

FIG. 2 is a general view showing a device used for cutting the substrate. The device is the same type of device as the general laser cleavage-cutting device. A heating section of the device consists of a laser oscillator LO, a laser power source PS, and an optical system OS. A driving section of the device consists of a X-Y driving table, and a material securing stand MSS. A controlling section of the device has functions of laser output control for controlling the laser, laser focal position control, and table position control for controlling the X-Y driving table.

Figure 12:
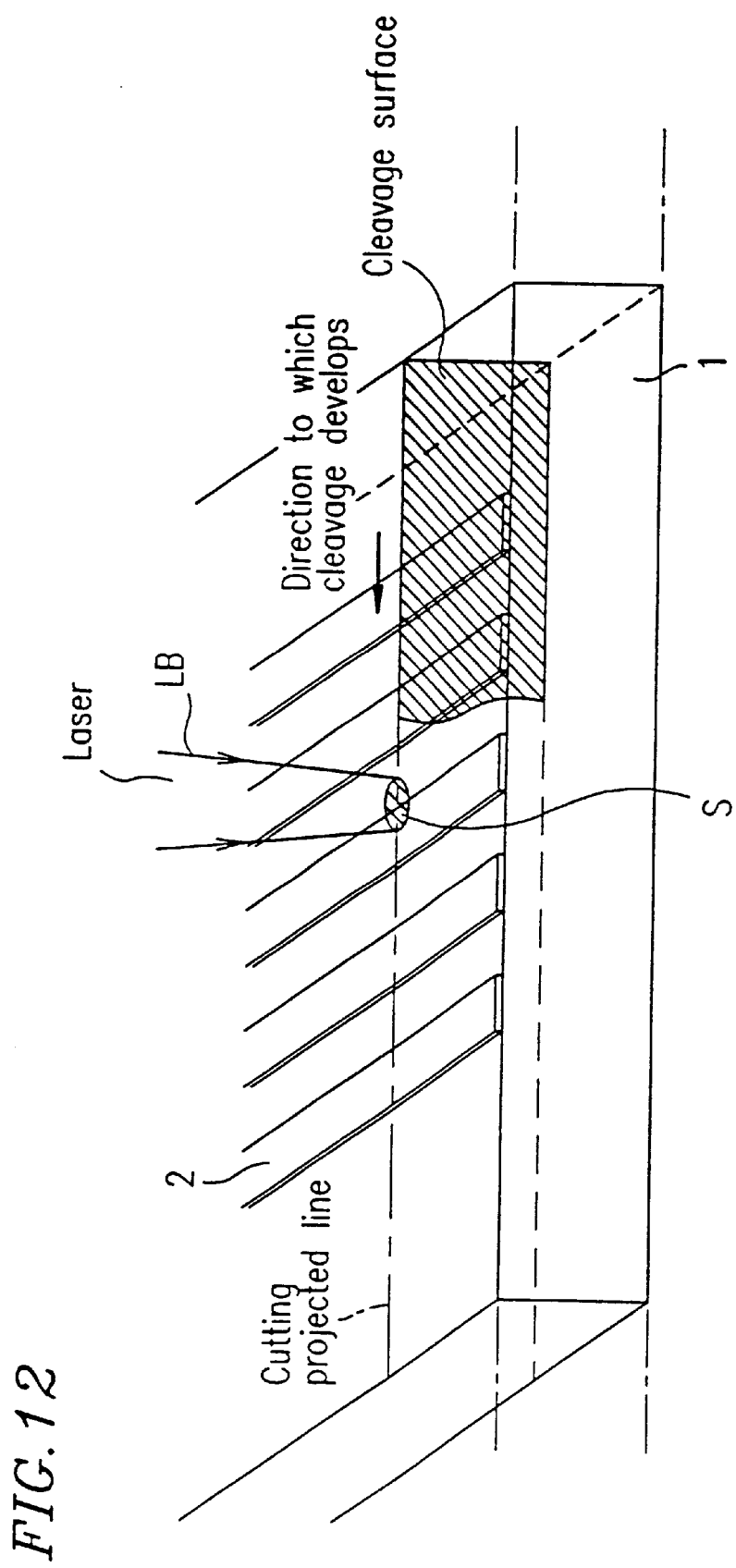
FIG. 12 is a perspective view for describing a method for cutting a substrate according to Comparative Example 1.

Table 1 shows the processing conditions and the processing results according to Example 1 of the present invention. Table 1 also shows Comparative Example 1 in which the substrate is cut in the same manner as that in Example 1 except that a laser beam is applied to the upper surface of the substrate 1 on which electrical lines 2 made of metal films are formed (see FIG. 12).

TABLE 1

|  | Example 1 | Comparative example 1 |
| --- | --- | --- |
| Laser used | $CO_2$ laser | $CO_2$ laser |
| Laser irradiated direction | From lower surface | From upper surface |
| Laser output | 25 W | 25 W |
| Cutting distance | About 30 cm | About 30 cm |
| Processing speed | 10 mm/s | 10 mm/s |
| Processing accuracy | 10~50 μm | 200~500 μm |
|  |  | (In the case where a percentage of an area occupied by electrical lines on cutting projected line is large, it is impossible to perform cutting.) |
| Other characteristics | No microcracks Mirror-finished surface | A number of cracks are generated |

As is apparent from Table 1, the processing accuracy in Example 1 wherein a laser beam is applied to the lower surface of the substrate is superior to that in Comparative Example 1 wherein a laser beam is applied to the upper surface of the substrate. Moreover, according to Comparative Example 1, when a percentage of an area occupied by the electrical lines on the cutting projected line was excessively increased, it became impossible to perform cutting, or else cleavage developed in a direction different from that of the cutting projected line. According to Example 1, on the other hand, such a phenomenon did not occur, and no microcracks were generated on the cut surface. This is because the laser cleavage-cutting method is essentially a method utilizing a thermal stress which is generated by the irradiation of a laser beam, and heat is not generated on the metal film if a material such as the metal film which reflects a laser beam exists on the surface of the substrate opposite that upon which a laser beam is incident. As a result, in the case where the cutting projected line existed across the plurality of the electrical lines 2 made of metal films as in Comparative Example 1 shown in FIG. 12, a temperature of the irradiated spot serving as a heat source varied in a cycle according to the existence of the electrical line 2. This is understood to be the reason for the deteriorated processing accuracy.

Figures 1, 3A:
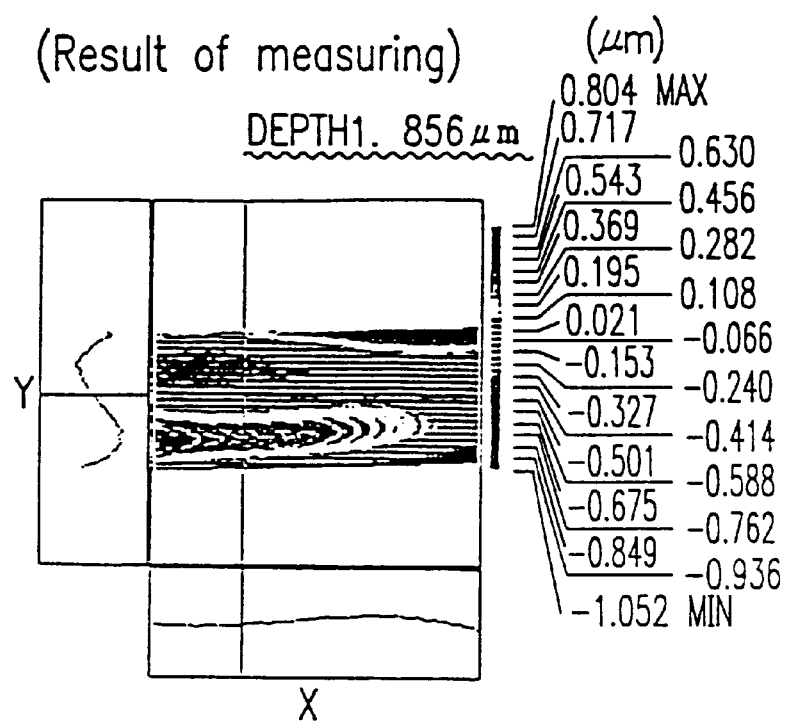
Figures 2, 3A:
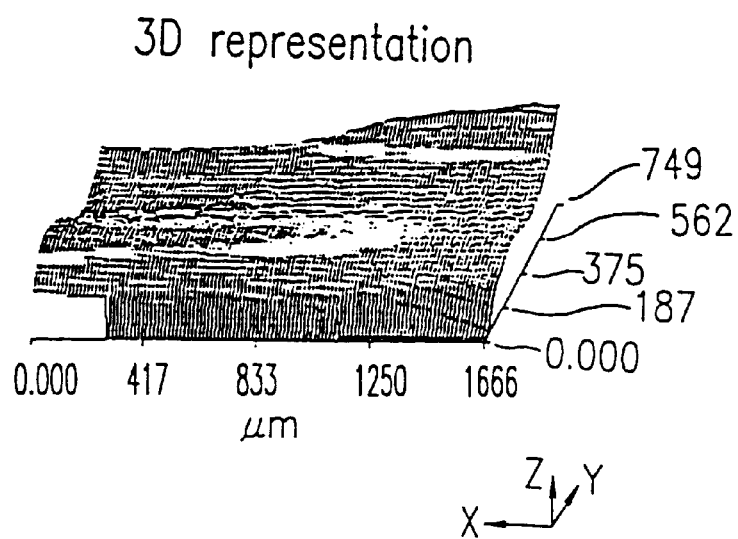

FIG. 3A-1 shows the result of measuring the surface roughness on the cut surface of the glass substrate according to Example 1. FIG. 3A-2 shows the three-dimensional representation for the shape of the cut surface of the glass substrate according to Example 1. In FIG. 3A-2, the X-Y plane is the cut surface, and X-axis indicates the direction of a cutting line. The Y-axis represents the thickness direction of the substrate, and the Z-axis shows a depth of concave and convex portions on the cut surface. According to FIG. 3A-1, a height difference between the highest point and the lowest point on the surface within the measured area of about 1.6 mm×0.8 mm is about 1.856 $\mu$m. Since the cut surface is extremely smooth as shown in FIG. 3A-2, it was confirmed that the cut surface had a mirror-like finished surface.

Figures 1, 3B:
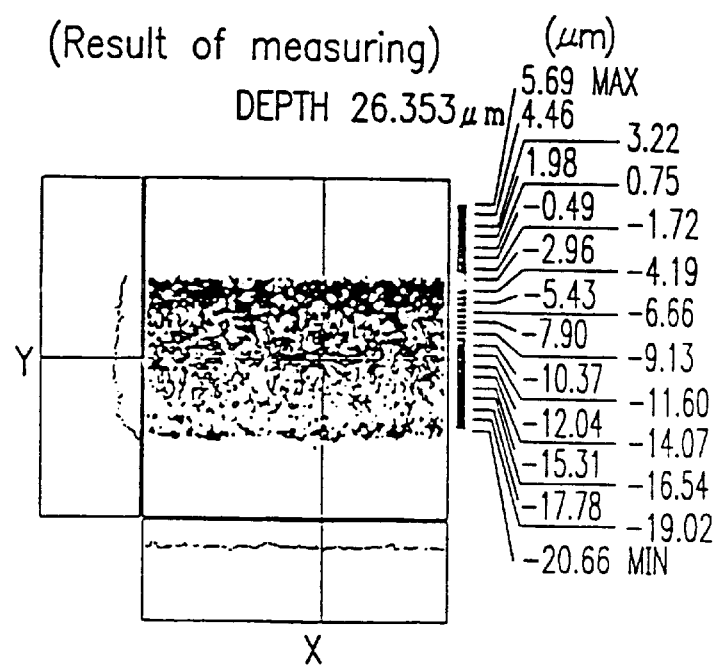
Figures 2, 3B:
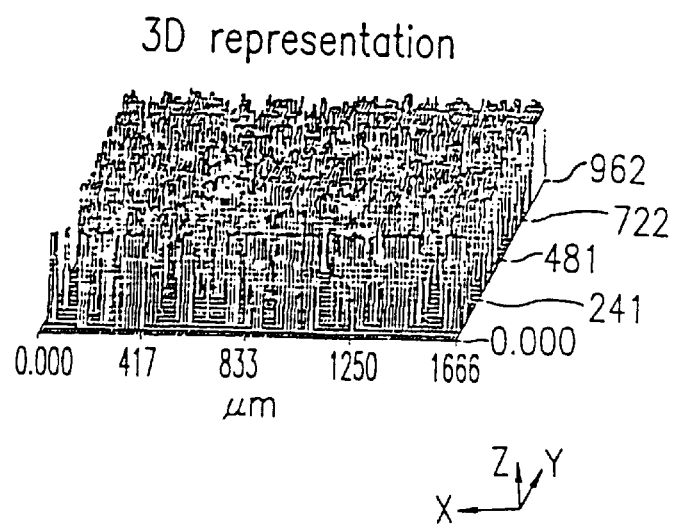

For the purpose of comparison, FIG. 3B-1 shows the result of measuring the surface roughness of the cut surface of the glass substrate which was cut by the conventional diamond blade dicing method. FIG. 3B-2 shows the three-dimensional representation for the shape of such a cut surface. According to FIG. 3B-1, a height difference between the highest point and the lowest point on the surface is about 26.353 $\mu$m. As is also apparent from FIG. 3B-2, the cut surface has a large degree of unevenness, and the graph supports that the cut surface scattered light.

EXAMPLE 2

In Example 2 of the present invention, a substrate is cut in the same manner as that in Example 1 shown in FIG. 1 except that electrical lines made of transparent conductive films are formed instead of the electrical lines made of metal films. Thus, as the general structure of the substrate depicted in FIG. 1 has not been altered, Example 2 will be discussed with respect to FIG. 1 as well.

A no-alkali glass suitable for use in a liquid crystal display panel, which has a thickness of about 1.1 mm (AN635, produced by Asahi Glass Co., Ltd.), is used as a substrate 1. Each of electrical lines 2 is formed as follows. As a transparent conductive film, an ITO film with a thickness of about 0.3 $\mu$m is deposited by the sputtering method, and the ITO film is patterned to form the electrical line 2.

Table 2 shows the processing conditions and the processing results according to Example 2 of the present invention. Table 2 also shows Comparative Example 2 in which the substrate is cut in the same manner as that in Example 2 except that a laser beam is applied to the upper surface of the substrate 1 on which the electrical lines 2 made of transparent conductive films are provided (see FIG. 12).

TABLE 2

|  | Example 2 | Comparative example 2 |
|---|---|---|
| Laser used | $CO_2$ laser | $CO_2$ laser |
| Laser irradiated direction | From lower surface | From upper surface |
| Laser output | 25W | 25W |
| Cutting distance | Abour 30 cm | Abour 30 cm |
| Processing speed | 10 mm/s | 10 mm/s |
| Processing accuracy | 10~50 $\mu$m | 200~300 $\mu$m |
| Other charcteristics | No microcracks Mirror-finished surface | Microcracks are generated |

As is apparent from Table 2, the processing accuracy in Example 2 wherein a laser beam is applied to the lower surface of the substrate is superior to that in Comparative Example 2 wherein a laser beam is applied to the upper surface of the substrate. Moreover, according to Example 2, no microcracks are generated on the cut surface. This is because the laser cleavage-cutting method is essentially a method utilizing a thermal stress which is generated by the irradiation of a laser beam, and an amount of the heat generation varies if a material such as the ITO film having a laser beam absorptivity different from that of the substrate exists on the surface of the substrate. As a result, in the case where the cutting projected line exists across the plurality of electrical lines 2 made of transparent conductive films as in Comparative Example 2 shown in FIG. 12, a temperature of the irradiated spot serving as a heat source varies in a cycle according to the existence of the electrical line 2. This is understood to be the reason for the deteriorated processing accuracy. According to Comparative Example 2, however, even when a percentage of an area occupied by the electrical lines 2 on the cutting projected line was increased, phenomenon such that it is impossible to perform cutting, or such that cleavage develops in a direction different from that of the cutting projected line was not observed.

Without using the electrical lines made of transparent conductive films, the same pattern as that in the aforementioned Example 2 was formed using an insulation film such as $SiN_x$ film formed by chemical vapor deposition (CVD) method or a $TaO_x$ film formed by the sputtering method, an organic film such as a color resist, or the like, and the substrate cutting process was evaluated. Consequently, substantially the same results as those in Table 2 were obtained.

As shown in Examples 1 and 2 described above, by using the method described herein for cutting the glass substrate of a liquid crystal display panel on which the electrical lines or insulation film are provided, broken chips, particles, ground chips, and the like are not generated. In addition, excellent processing accuracy of about 10 $\mu$m to about 50 $\mu$m is obtained.

Conventionally, when the glass substrate for a display panel is cut, steps such as a chambering step for removing microcracks or burr at the edge and a washing step for removing broken chips, particles, ground chips, and the like are required. However, by using the method for cutting a substrate according to the present invention, such post-steps can be omitted. Accordingly, the fabrication process can be simplified, and thus cost savings can be realized.

Particularly when the active matrix substrate is cut, since the semiconductor elements such as TFTs are exposed on the surface of the substrate, close attention needs to be paid for chemical contamination from an external laser source, adhering of broken chips, particles, ground chips, and the like, which are generated upon cutting the substrate, the resulting flaw on the surface of the substrate, etc. Chemical contamination caused by washing, adhering of broken chips, particles, or ground chips, and the like can be avoided by using the method for cutting a substrate according to the present invention. Moreover, since the cutting step can be performed inside a clean room, yield can be significantly improved.

Furthermore, in the case where the method for cutting a substrate according to the present invention is employed, since it is possible to cut a substrate without contacting the substrate, automation of the device can be easily realized. Thus, the method of this invention is superior to the conventional method in terms of productivity.

As described above, the method for cutting a substrate according to the present invention is suitable for cutting the glass substrate for a display panel of a liquid crystal display device or the like. The method of this invention is especially suitable for use in the step of cutting a mother substrate on which electric circuitry such as electrical lines, an insulation film, and semiconductor elements is provided using the known process with a predetermined size.

Figure 4:
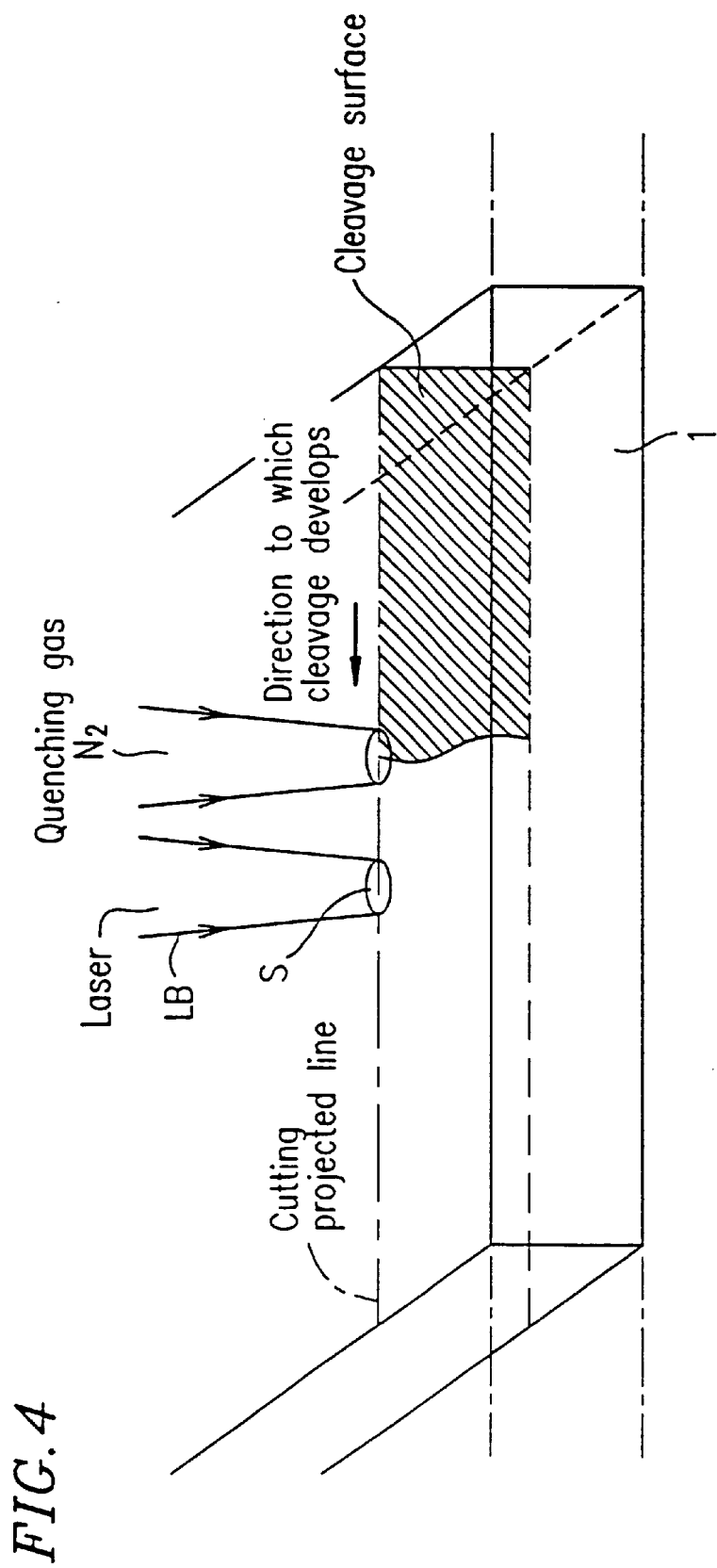
FIG. 4 is a perspective view for describing a method for cutting a substrate using a quenching gas.

By providing a mechanism for spraying a gas for quenching immediately behind the laser beam irradiated spot (i.e., at a side opposite to the direction to which the cleavage develops), a thermal stress can be generated in a significant manner. It is also possible to increase the processing speed up to about 200 mm/s. For example, as shown in FIG. 4, it is effective to spray $N_2$ gas at a position behind the laser beam spot by a distance of about 2 mm to about 5 mm.

Furthermore, it is also possible to increase the cutting speed by heating two or more points using two or more laser beam irradiated spots.

As a shape for the laser beam irradiated spot, a circle with a diameter of about 0.5 mm to about 3 mm, an ellipse having substantially the same area as that of a corresponding circle, or the like may be used. An optimum spot shape may be set in accordance with the processing accuracy and/or the processing speed.

Materials for the electrical line and the insulation film, the type of the semiconductor element, the kind of the glass substrate, and the like are not limited to those described in the aforementioned examples. The present invention is applicable even when other materials for the electrical line and the insulation film, other type of the semiconductor element, and other kind of the glass substrate are employed. The method for cutting a substrate according to the present invention is not limited for use in a liquid crystal display panel. By selecting a laser to be used in consideration of the light absorbing characteristics of the substrate, the method for cutting a substrate according to the present invention can be used in the steps of cutting various types of substrates such as a ceramic substrate, a semiconductor substrate, and the like. For example, the method for cutting a substrate according to the present invention can be applied to a material such as silicon, gallium arsenide, gallium phosphide, alumina, zirconium oxide, barium titanate, quartz glass, borosilicate glass, or soda glass.

Although the cases where a pair of mother substrates on which electric circuitry such as electrical lines, an insulation film, and semiconductor elements is provided are cut to a predetermined size are described in the aforementioned Examples 1 and 2, the method for cutting a substrate according to the present invention can be used for the cutting of a curved line which is difficult to perform using the conventional cutting method. Hereinafter, such a case will be described in Example 3 of the present invention.

EXAMPLE 3

Figure 5A:
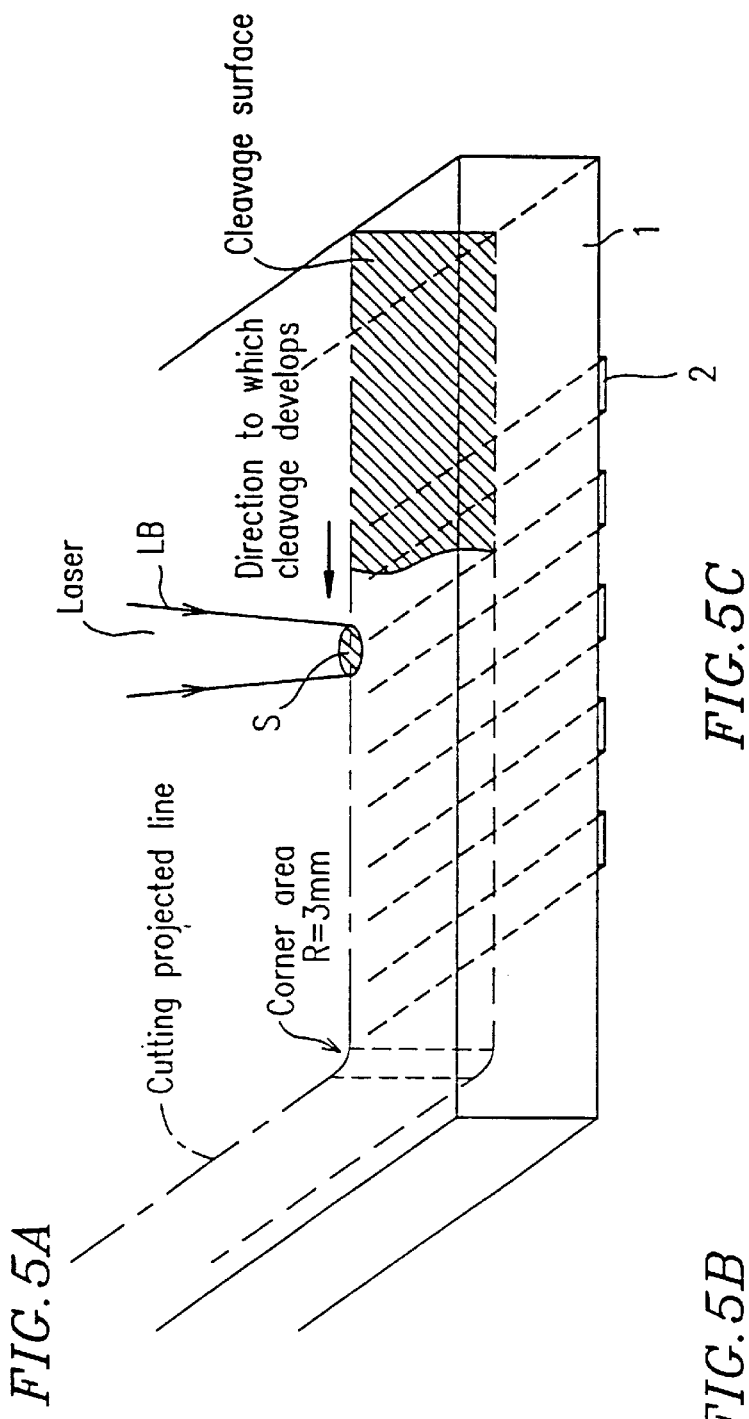
FIG. 5A to 5C are perspective views for describing a method for cutting a substrate according to Example 3 of the present invention.

FIG. 5A is a perspective view for describing a method for cutting a substrate according to Example 3 of the present invention. In Example 3, a corner area of the substrate is cut so as to have a curved shape with a radius of curvature R of about 3 mm.

Figure 5C:
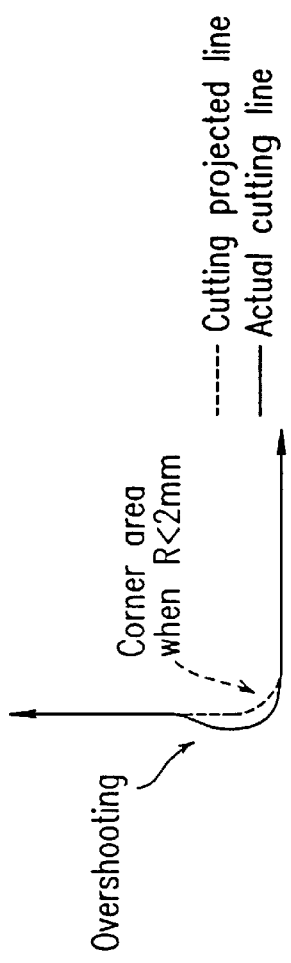
Figure 5B:
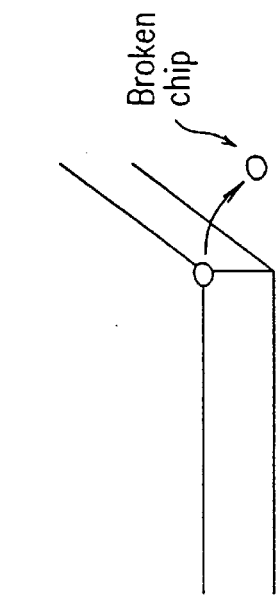

Upon cutting a glass substrate for a display panel in a predetermined size from a mother substrate, it is not known how to cut the corner area in a curved shape if the conventional method for cutting a substrate is employed. Thus, the corner area after the cutting process has a sharp edge. In such a case, as shown in FIG. 5B, chipping (i.e., broken chip) is more likely to occur in the corner area upon cutting the substrate, and thus defects are more likely to occur by adhesion of such broken chip to the surface of the substrate. Moreover, even when chipping in the corner area of the substrate does not occur upon cutting the substrate, chipping in the corner area tends to occur when the cut substrate is transported to the post-step since the corner area of the substrate contacts a substrate holder.

On the other hand, by cutting the corner area in a curved shape upon cutting the substrate as in Example 3 of the present invention, chipping of the corner area of the substrate becomes less likely to occur upon cutting the substrate or after cutting the substrate. As a result, it is possible to substantially prevent the generation of a broken chip due to the chipping of a part of the corner of the substrate. Moreover, even when an operator's hand touches the cut substrate, since the corner area thereof does not have a sharp edge, handling can be performed safely.

As shown in FIG. 5A, the cutting of the corner area can be performed in a continuous manner. In principle, it is possible to cut the corner area in a curved shape with any radius of curvature.

Accordingly, the relationship between the radius of curvature in the corner area and the processing accuracy was experimentally studied. As a result, in the case where the radius of curvature R was about 2 mm or greater, it was confirmed that the corner area can be cut in a curved shape. However, in the case of the radius of curvature smaller than about 2 mm, as shown in FIG. 5C, it was confirmed that the cutting line actually obtained slightly overshot the cutting projected line.

As described above, the method for cutting a substrate according to the present invention can be used in the step of cutting a pair of mother substrates, on which electric circuitry such as electrical lines, an insulation film, and semiconductor elements is provided, to a predetermined size. The present invention is also applicable for the case in which after fabricating a panel constituting section by attaching together a pair of mother substrates, on which electric circuitry is provided, the panel constituting section is cut so as to obtain a display panel of a predetermined size. Hereinafter, such a case will be described in Example 4 of the present invention.

EXAMPLE 4

Figure 6A:
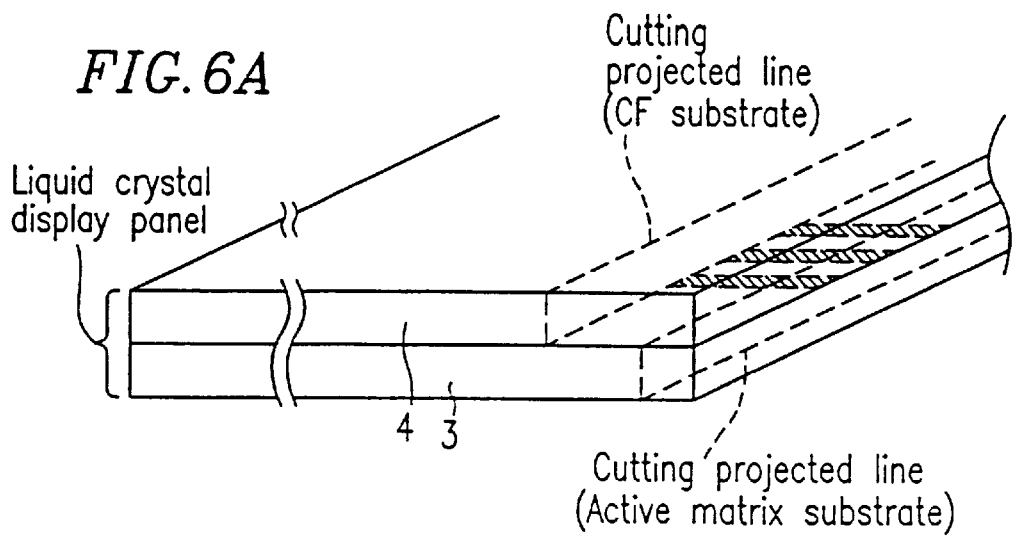
FIGS. 6A to 6C are perspective views for describing a method for cutting a substrate according to Example 4 of the present invention.
Figure 6B:
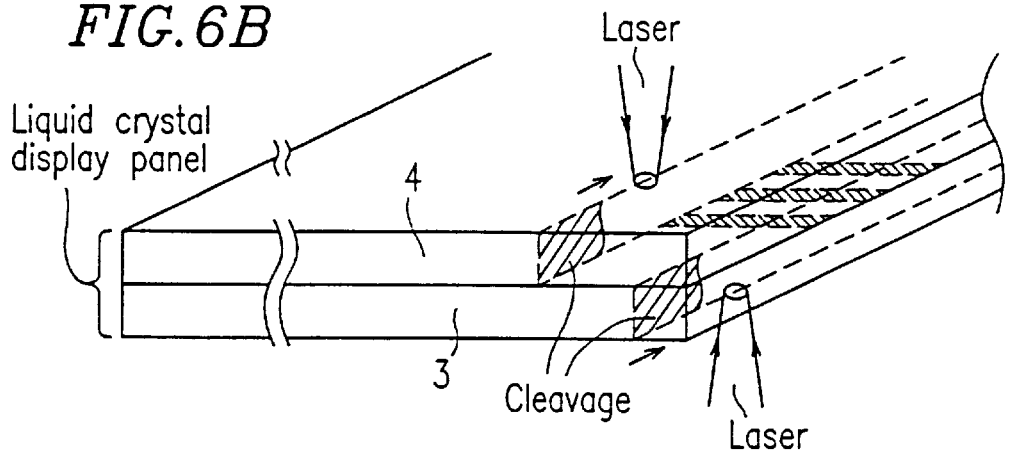
Figure 6C:
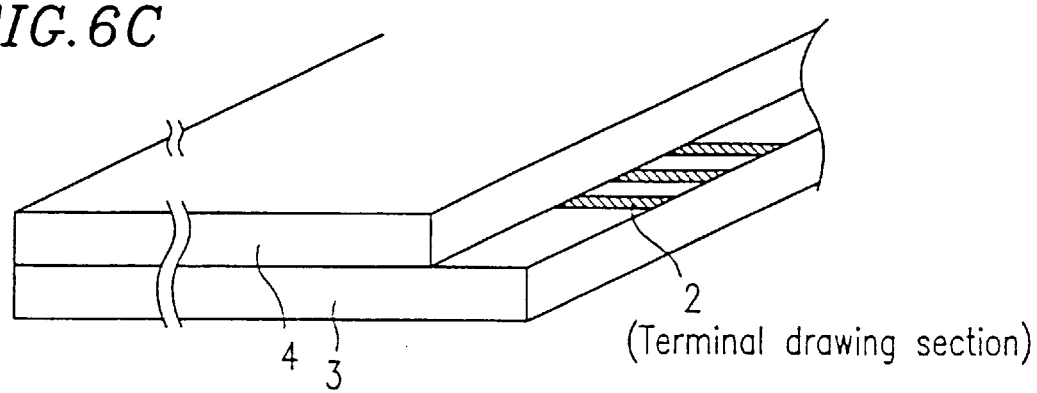

FIGS. 6A to 6C are perspective views for describing a method for cutting a substrate according to Example 4 of the present invention. In Example 4, as shown in FIG. 6A, after an active matrix substrate 3 including TFTs provided thereon and a color filter (hereinafter, referred to as "CF") substrate 4 including a CF layer provided thereon are attached to each other to make a panel, a laser beam is applied to cut the substrate as shown in FIG. 6B. As a result, as shown in FIG.

6C, the CF substrate 4 is cut out in a predetermined size, and electrical lines 2 provided on the active matrix substrate 3 are exposed as terminal drawing sections.

The electrical lines 2 on the active matrix substrate 3 are disposed inside the liquid crystal display panel. Therefore, as shown in FIG. 1 of Example 1, a laser beam is applied to the lower surface on which no electrical lines 2 are provided, thereby cutting the substrate with high accuracy. Although laser irradiation needs to be performed twice, i.e., irradiation from the side of the active matrix substrate 3 and irradiation from the side of the CF substrate 4, productivity can be improved by using a device capable of simultaneously irradiating laser beams to the upper and the lower surfaces of the liquid crystal display panel. Accordingly, even when any electrical lines or insulation film exists on the cutting projected line of the active matrix substrate or the CF substrate, it is possible to easily cut the substrate while keeping the processing conditions such as laser power, spot diameter, and cutting speed unchanged.

Even when the panel is cut out as described above, it is possible to cut the corner area thereof in a curved shape as in Example 3. Accordingly, chipping in the corner area of the panel can be prevented from occurring, thereby improving a defect ratio and operational safety.

The method for cutting a substrate according to the present invention can be used in fabricating a liquid crystal display device with a large screen in which a plurality of liquid crystal display panels are disposed adjacent with each other (e.g., the liquid crystal display device as disclosed in Japanese Laid-open Publication No. 8-122769).

Figure 7A:
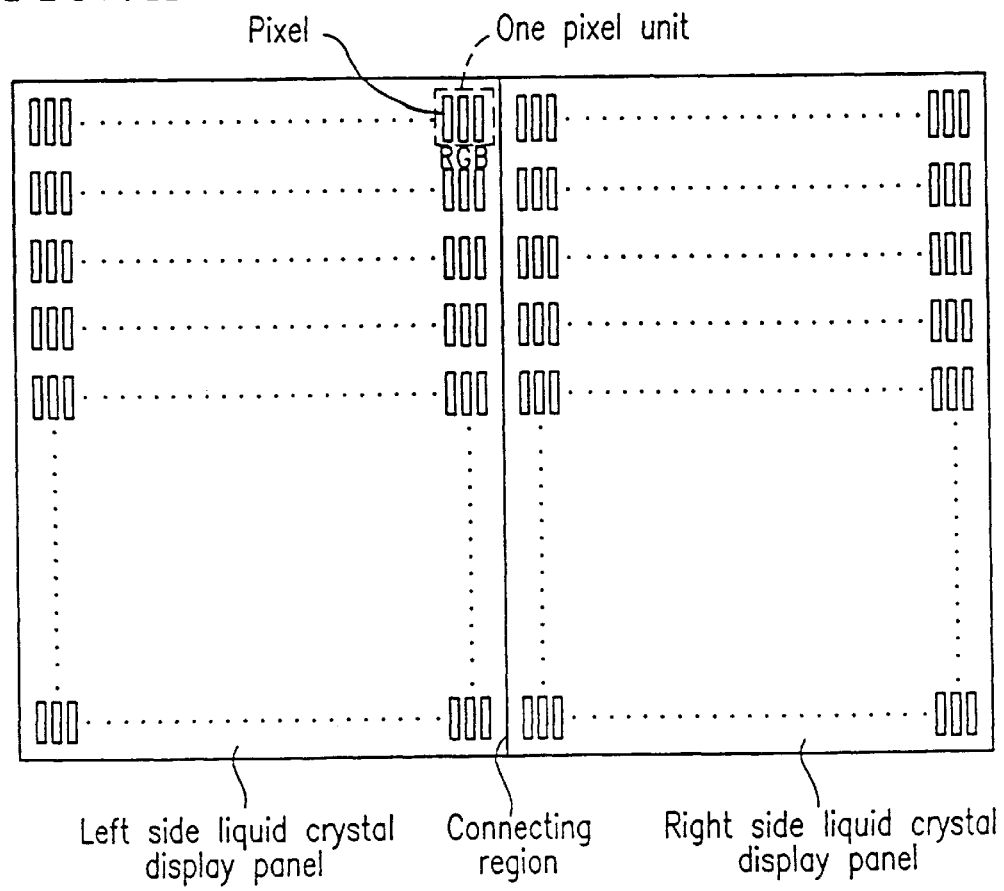
FIG. 7A is a plan view showing a liquid crystal display device disclosed in Japanese Laid-open Publication No. 8-122769.
Figure 7B:
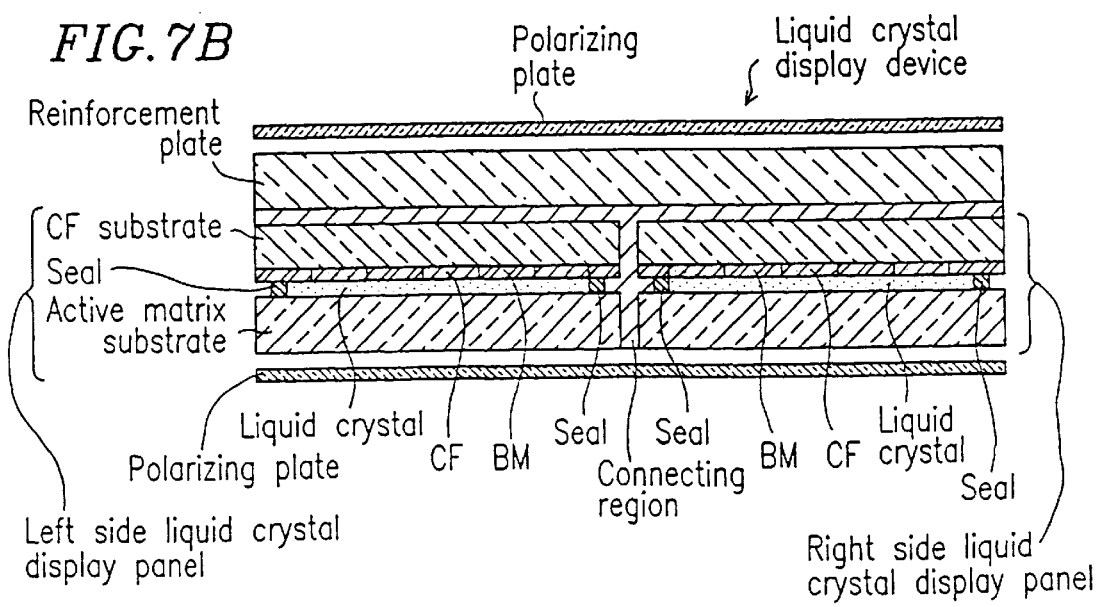
FIG. 7B is a cross-sectional view of the liquid crystal display device disclosed in Japanese Laid-open Publication No. 8-122769.

FIG. 7A is a plan view showing the liquid crystal display device disclosed in Japanese Laid-open Publication No. 8-122769, and FIG. 7B is a cross-sectional view of the same liquid crystal display device. In the process of fabricating this liquid crystal display device, in order to make stitching between liquid crystal display panels less noticeable, it is typically needed to cut the connecting region between the liquid crystal display panels with high processing accuracy. Since the method for cutting a substrate according to the present invention can realize the processing accuracy of about 10 μm to about 50 μm as shown in Table 1, the method of this invention is extremely effective to satisfy the aforementioned needs. Moreover, since it is possible to obtain a mirror-like finished cut surface having no microcracks, the wettability of an adhesive is improved when cut surfaces are connected to each other with such an adhesive, thereby improving the bonding strength. In addition, it is possible to eliminate the scattering of light at the interface between the adhesive and the cut surface.

Figure 11A:
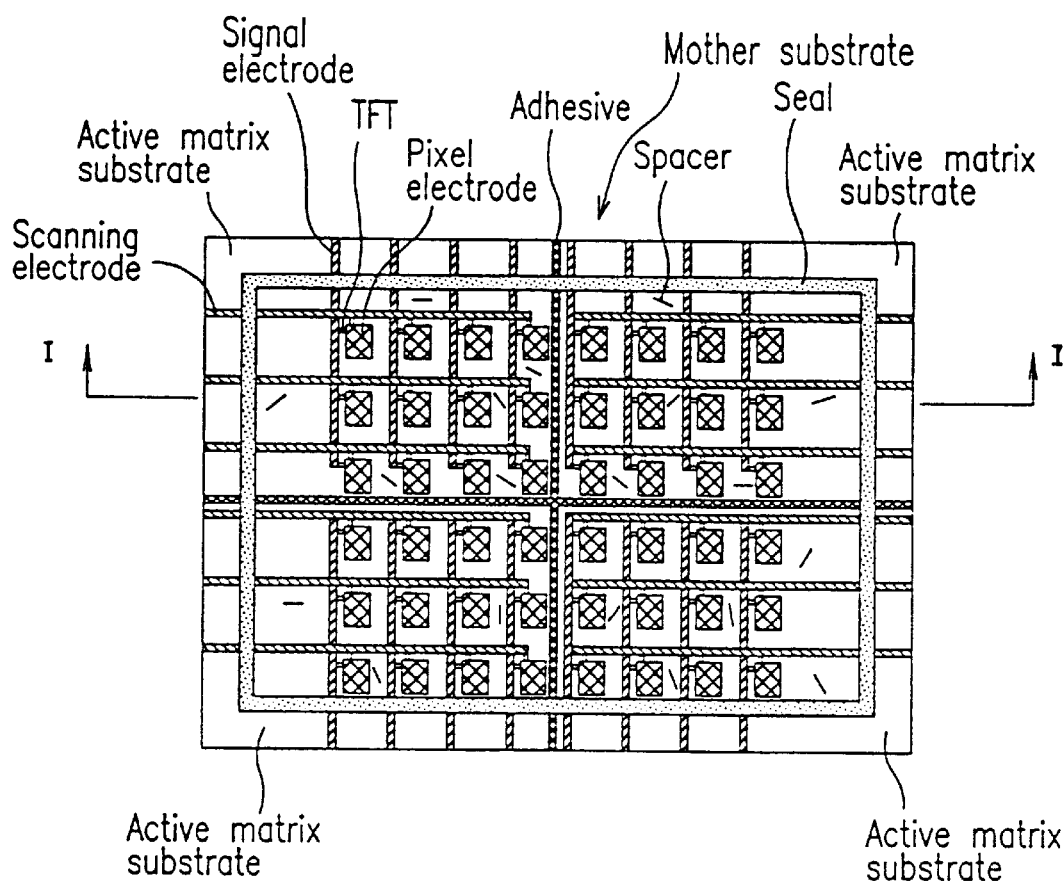
FIG. 11A is a plan view of a liquid crystal display panel disclosed in Japanese Laid-open Utility Model Publication No. 60-191029.
Figure 11B:
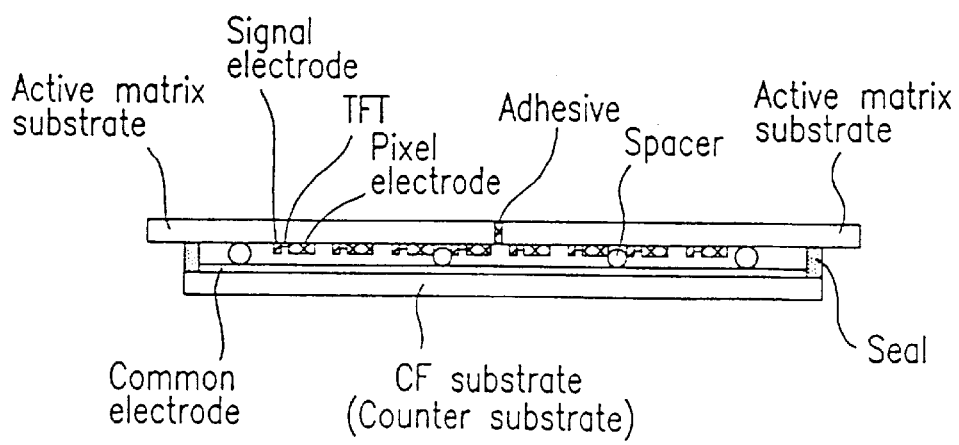
FIG. 11B is a cross-sectional view showing the liquid crystal display panel cut along line I—I in FIG. 11A.

The method for cutting a substrate according to the present invention can be used also in the fabrication of a liquid crystal display panel using a large substrate composed by connecting a plurality of small substrates along their side surfaces as at least one of a pair of substrates constituting the liquid crystal display panel (e.g., the liquid crystal display panel disclosed in Japanese Laid-open Utility Model Publication No. 60-191029 shown in FIGS. 11A and 11B). Hereinafter, such a case will be described in Example 5 of the present invention.

EXAMPLE 5

Figure 8:
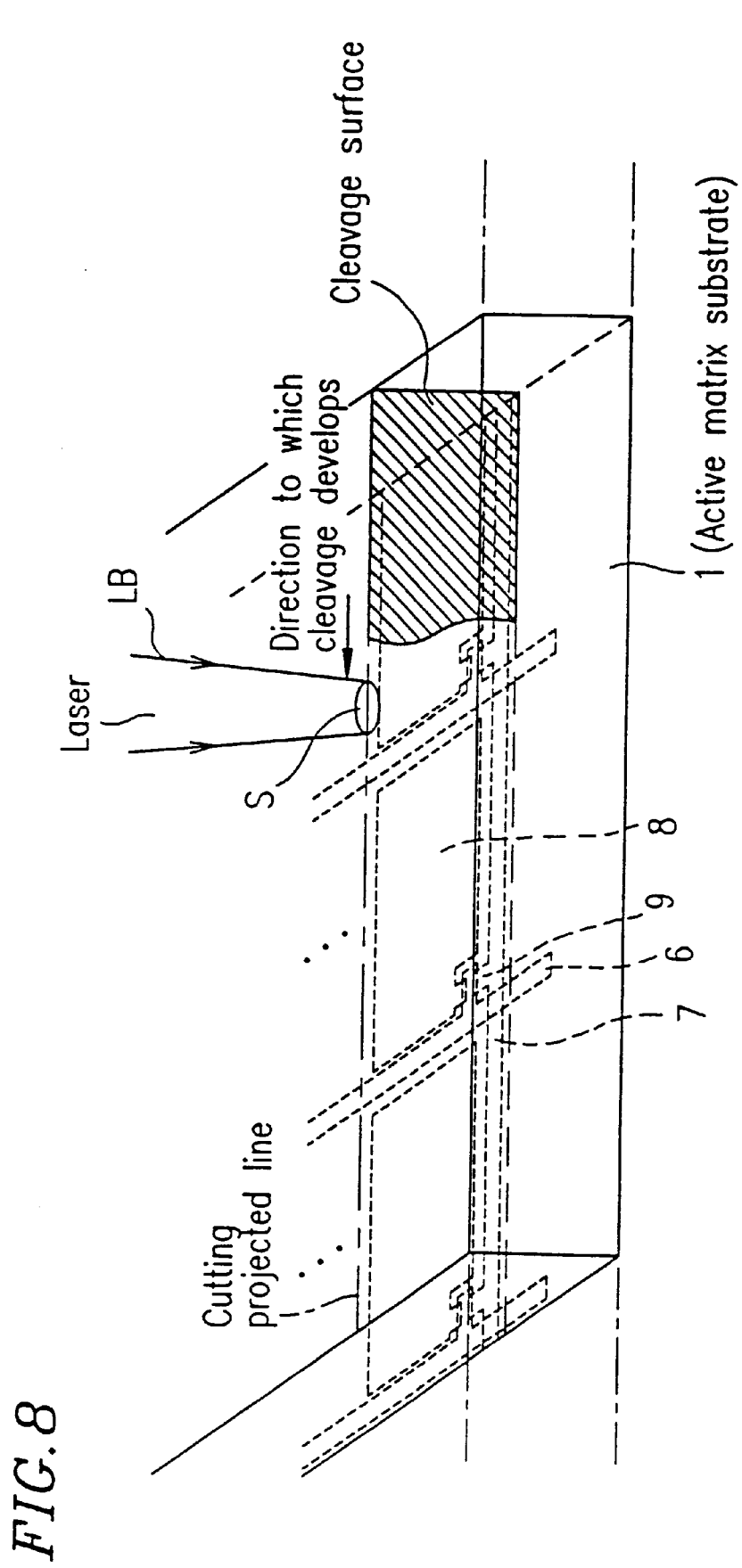
FIG. 8 is a perspective view for describing a method for cutting a substrate according to Example 5 of the present in invention.

FIG. 8 is a perspective view for describing a method for cutting a substrate according to Example 5 of the present invention. In Example 5, a surface of an active matrix substrate 1 on which scanning electrodes 6, signal electrodes 7, pixel electrodes 8, and TFTs 9 are provided (hereinafter, such a surface is referred to as an "upper surface") is disposed so as to face down. In the same manner as that in Example 1, a laser beam is applied to a surface opposite the upper surface (hereinafter, referred to as a "lower surface"). By moving the irradiated spot along the cutting projected line, cleavage is developed.

In fabricating the liquid crystal display panel shown in FIGS. 11A and 11B, a mother substrate serving as an active matrix substrate on which pixel electrodes, TFTs, and the like are provided is cut out in a predetermined size so as to produce small substrates. Thereafter, the plurality of small substrates are connected at the side surfaces thereof so as to fabricate one large active matrix substrate. Next, the large active matrix substrate is attached to one large substrate (i.e., counter substrate) including a color filter (CF) layer provided thereon so as to produce a panel shown in FIG. 11B. Upon cutting the mother substrate serving as the active matrix substrate, it is necessary to perform cutting in the vicinity of the display pixels in a highly accurate manner in order to make the stitching between the substrates less noticeable by making the connecting region as small as possible. For such a purpose, pixel electrodes, semiconductor elements (e.g., TFTs), and the like are disposed at positions about 100 μm to about 500 μm away from the edge of the connecting surface, although the distance varies depending on the size of the liquid crystal display panel with a large screen and the resolution thereof. Therefore, it is necessary to prevent the TFTs in the vicinity of the laser irradiated spot from being affected by heat conduction, or to prevent the TFTs from being directly irradiated with a laser beam.

According to the method for cutting a substrate according to Example 5 of the present invention, the TFTs are not directly irradiated with a laser beam. In addition, this method of the present invention can prevent the adverse effects on the device characteristics caused by the influence of heat conduction on the TFTs or optical deterioration in the TFTS. Moreover, the method for cutting a substrate according to Example 5 of this invention is a completely dry method which requires no grinding water and generates no ground chips. Therefore, it is possible to eliminate problems such that grinding water and ground chips adversely affect the semiconductor chips or organic films on the substrate, which are generated when the substrate is cut using the conventional diamond blade dicing method. Furthermore, since it is possible to obtain a mirror-finished cut surface having no microcracks, the wettability of an adhesive is improved when cut surfaces are connected to each other with such an adhesive, thereby improving the bonding strength. In addition, it is possible to eliminate the scattering of light at the interface between the adhesive and the cut surface.

The mother substrate for an active matrix substrate was cut in a predetermined size using the method for cutting a substrate according to the present example so as to make small substrates, and a liquid crystal display panel shown in FIGS. 11A and 11B was fabricated. As a result, display performance was uniform also in the connecting region in the active matrix substrate.

Figure 13:
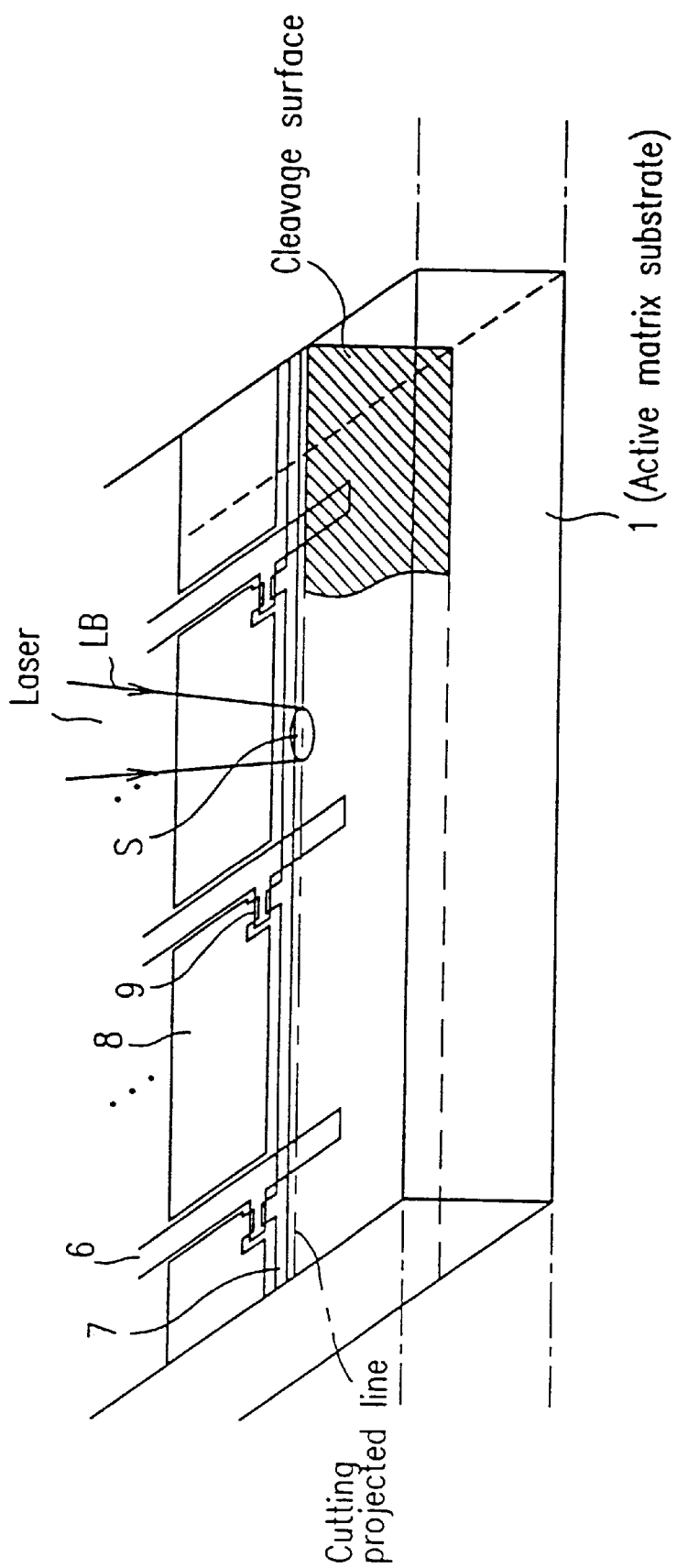
FIG. 13 is a perspective view for describing a method for cutting a substrate according to Comparative Example 3.

For the purpose of comparison, a method for cutting a substrate according to Comparative Example 3 wherein a laser beam is applied to the upper surface on which scanning electrodes 6, signal electrodes 7, pixel electrodes 8, and TFTs 9 are provided is shown in FIG. 13. In this case, if the laser spot S has a laser spot diameter of about 1 mm, for example, the semiconductor element (i.e., TFT), which is disposed at a position away from the substrate cutting projected line by a distance of about 100 μm to about 500 μm, is irradiated with a laser beam during the cutting of the substrate. Since characteristics of the TFT made of amorphous Si are changed by the irradiation of a laser beam LB, only the TFTs positioned in the vicinity of the cutting line experience a change in their characteristics. Even when the semiconductor element (i.e., TFT) is not directly irradiated with a laser beam, the vicinity of the laser spot S tends to exude heat. Thus, characteristics change is more likely to occur. Therefore, when a mother substrate for an active matrix substrate is cut in a predetermined size using the method for cutting a substrate according to Comparative Example 3 so as to make small substrates, and the liquid crystal display panel shown in FIGS. 11A and 11B is fabricated, it is not likely to have uniform display performance in the connecting region of the active matrix substrate.

In the display device which realizes a large screen by connecting a plurality of display panels or a plurality of small substrates (e.g., the liquid crystal display devices shown in FIGS. 7A and 7B and FIGS. 11A and 11B), the case where four liquid crystal display panels or four small substrates are connected so that each row and each column have two panels or two substrates, respectively, will now be considered.

Figure 9A:
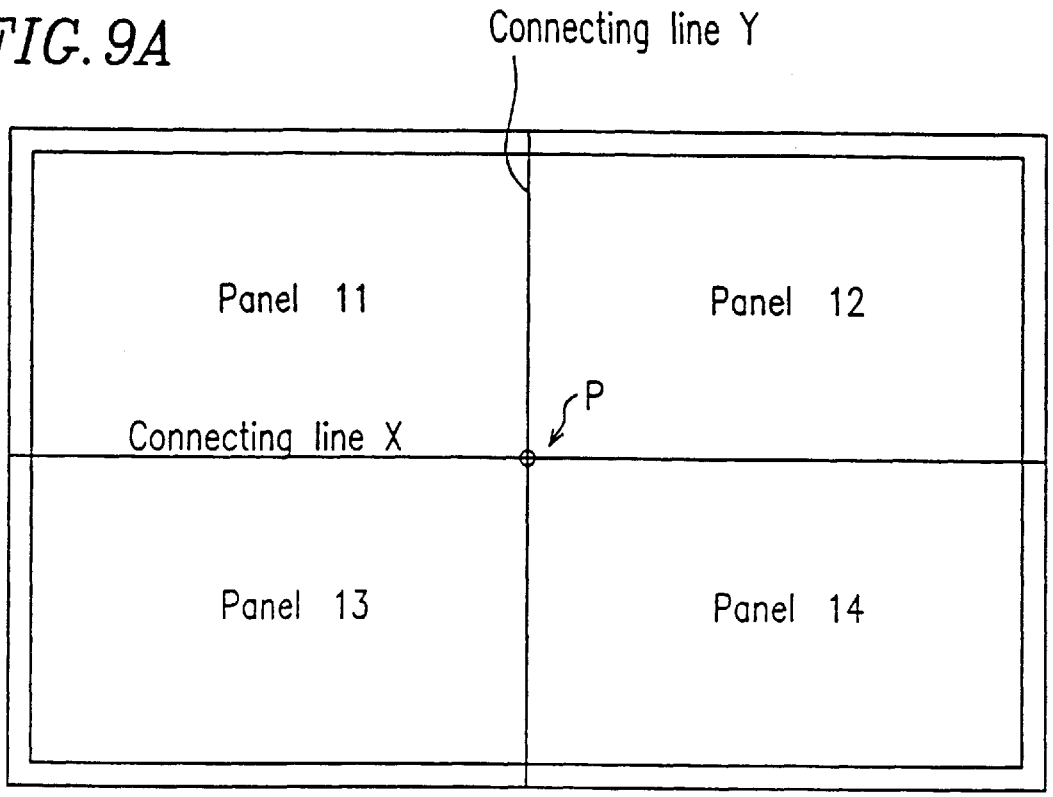
FIG. 9A is a plan view showing a liquid crystal display device in which four display panels are connected so that each row and each column have two panels, respectively.

FIG. 9A is a schematic plan view showing a liquid crystal display device in which four display panels 11 to 14 are connected so that each row and each column have two panels, respectively. In such case, a problem occurs in that a cross area P at the intersection of a vertical connecting line Y and a horizontal connecting line X clearly stands out to a viewer.

Reasons why the cross area P may stand out include a difference in display characteristics among display panels or small substrates, an accuracy error of connection pitch, and the like. In addition to such reasons, it was found that a lack of processing accuracy in the corner area of each of the display panels or the small substrates adds to the undesired effects.

For example, in the case where the connecting line X and the connecting line Y are cut using the conventional method for cutting a substrate, as shown in FIG. 5B, chipping in the corner area of the substrate is more likely to occur during the cutting treatment. When four display panels each having such chipping in the corner area thereof are connected to each other, chipping defects of the four display panels are concentrated in the cross area P at the intersection of the vertical connecting line Y and the horizontal connecting line X. As a result, the scattering or refraction of light specifically occurs at the cross area P. Therefore, the cross area P clearly stands out to a viewer.

Figure 9B:
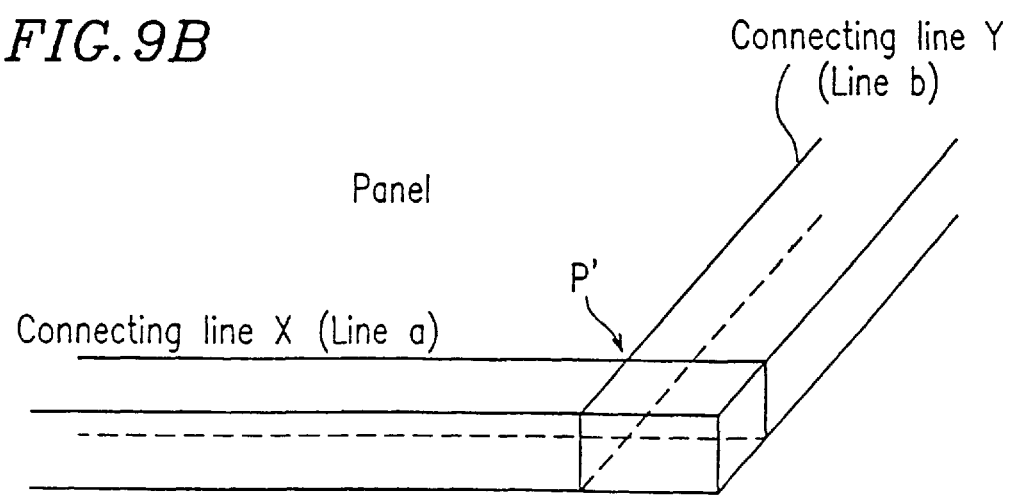
FIG. 9B is a perspective view for describing a method for cutting a substrate according to the present invention.
Figure 10A:
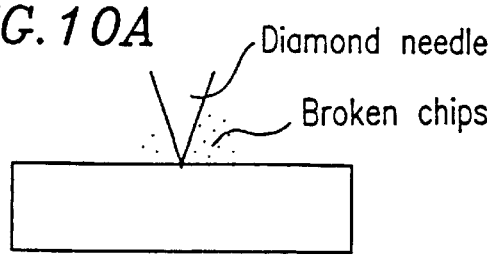
FIG. 10A is a cross-sectional view showing a diamond scribing method.
Figure 10A:
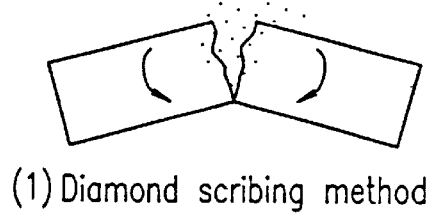
Figure 10B:
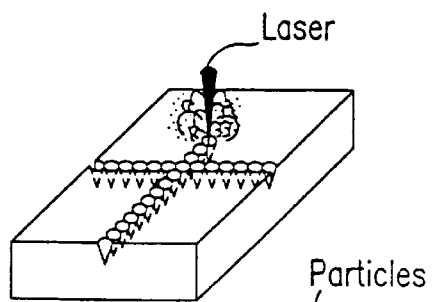
FIG. 10B is a perspective view showing a laser scribing method.
Figure 10B:
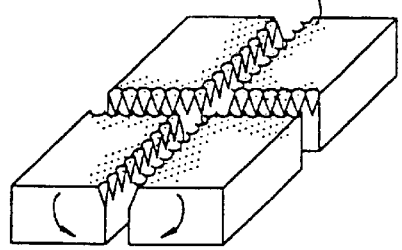
Figure 10C:
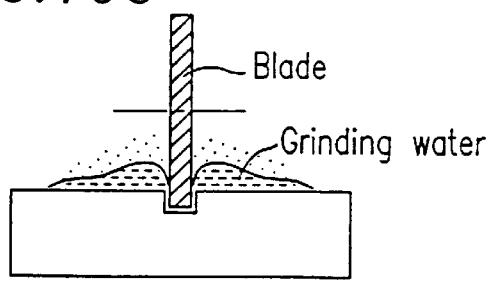
FIG. 10C is a cross-sectional view showing a diamond blade dicing method.
Figure 10D:
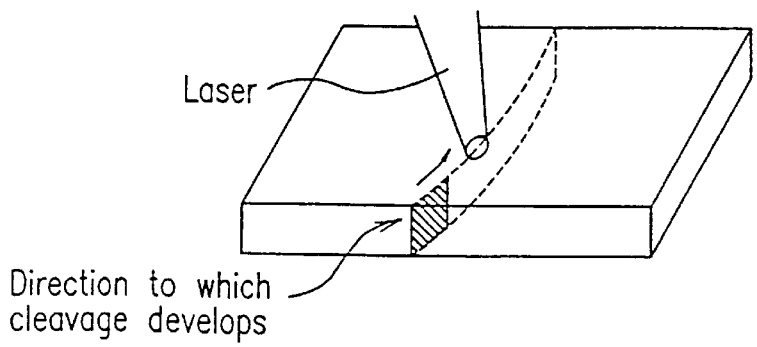
FIG. 10D is a perspective view showing a laser cleavage-cutting method.

According to the method for cutting a substrate of this invention, on the other hand, as shown in FIG. 9B, it was found that chipping does not occur in a corner area P' of the substrate during the step of cutting the substrate even when cutting of the substrate is performed along a line a corresponding to the connecting line X and a line b corresponding to the connecting line Y. The reason why chipping does not occur appears to be as follows.

In the case where the corner area is cross-cut as described above, line a may, for example, be cut first followed by cutting line b which crosses line a. At this time, if the method for cutting a substrate according to the present invention is used, the cut surface along the line a has a mirror-like finished, and no microcracks or residual stress exists along the cut surface. As a result, cutting along line b can be performed without being influenced by the already cut line a. Thus, no chipping occurs in the corner area P' of the substrate.

Cutting of the display panel or cutting of the substrate into small substrates was performed using the method for cutting a substrate according to the present invention. The resulting cut display panels or small substrates were connected so that each row and each column have two panels or substrates, respectively, in order to make a liquid crystal display device with a large screen. As a result, satisfactory display characteristics such that the cross area P at the intersection of the vertical and horizontal lines Y and X is barely noticeable were obtained.

As described in detail above, according to the present invention, variation in a thermal stress which is generated when irradiated with a laser beam does not occur. As a result, it is possible to smoothly cut the substrate with high accuracy. It is also possible to obtain a mirror-like finished cut surface having no microcracks.

According to the present invention, a thermal stress which is generated when irradiated with a laser beam is not varied, and thus it is possible to cut the substrate smoothly and in an accurate manner. As a result, the display panel can be produced with high yield. Moreover, since semiconductor elements (TFTs or the like) are less likely to have adverse effects such as optical deterioration, heat conduction, or the like, problems such as a characteristics change occurring in the semiconductor element do not occur. Furthermore, steps such as a chambering step for removing microcracks or burr at the edge and a washing step for removing broken chips, particles, ground chips, and the like, which are performed after the cutting step, can be omitted. As a result, the process for fabricating a display panel can be simplified. Particularly when the active matrix substrate is cut, since the present invention can avoid chemical contamination from the external source, the adhering of broken chips, particles, ground chips, and the like generated upon cutting the substrate, the resulting flaw on the surface of the substrate, and the like, yield can be improved. Furthermore, since it is possible to cut a substrate without contacting the substrate, automation of the device can be easily realized. Thus, the present invention can improve productivity.

According to the present invention, a thermal stress which is generated when irradiated with a laser beam is not varied, and thus it is possible to cut the substrate smoothly and in an accurate manner. As a result, the display panel with a large screen can be produced with a lower probability of error. Moreover, since semiconductor elements (TFTs or the like) are less likely to have adverse effects such as the optical deterioration, heat conduction, or the like, problems such as a characteristics change in the semiconductor element do not occur. Furthermore, since it is possible to obtain a mirror-like finished cut surface having no microcracks, the bonding strength between the cut surfaces is improved. In addition, it is possible to avoid the scattering of light at the interface between the adhesive and the cut surface. Thus, excellent display quality can be realized.

According to the present invention, a thermal stress which is generated when irradiated with a laser beam is not varied, and thus it is possible to obtain a display panel of a predetermined size in an accurate manner. As a result, the display panel can be produced with high manufacturing yield. Moreover, since semiconductor elements (TFTs or the like) are less likely to have adverse effects such as optical deterioration, heat conduction, or the like, problems such as a characteristics change in the semiconductor element do not occur.

According to the present invention, a thermal stress which is generated when irradiated with a laser beam is not varied, and thus it is possible to readily obtain small panels of a predetermined size in an accurate manner. As a result, the display panel with a large screen can be produced with high manufacturing yield. Moreover, since semiconductor elements (TFTs or the like) are less likely to have adverse effects such as optical deterioration, heat conduction, or the like, problems such as a characteristics change in the semiconductor element do not occur. Furthermore, since it is possible to obtain a mirror-like finished cut surface having no microcracks, the bonding strength between the cut surfaces is improved. In addition, it is possible to eliminate the scattering of light at the interface between the adhesive and the cut surface. Thus, excellent display quality can be realized.

According to the present invention, chipping is less likely to occur in the corner area of the substrate or the display panel. Thus, it is possible to prevent the generation of broken chips resulting from the chipping of the corner area, thereby improving yield. Moreover, since the corner area thereof does not have a sharp edge, operational safety can be improved.

According to the present invention, it is possible to perform cutting as intended without overshooting the cutting projected line in the corner area of the substrate or the display panel. As a result, the display panel can be fabricated with high yield.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for cutting a circuit substrate which includes a substrate with an upper surface and a lower surface and electric circuitry provided on at least one surface of the substrate, comprising the steps of:
    irradiating a laser beam onto another surface of the substrate so that a thermal stress is generated inside the substrate using an irradiated spot of the laser beam as a heat source; and
    moving the irradiated spot so as to out the substrate by utilizing the thermal stress without forming a scribing line.

2. A method for cutting a circuit substrate according to claim 1, further comprising the step of spraying a medium for quenching immediately after the laser beam irradiated spot.

3. A method for fabricating a display panel according to claim 1, further comprising an electrical line arranged discontinuously on a line which is scanned by a laser beam and on a surface which is opposite to a laser irradiated surface.

4. A method for fabricating a display panel including a first circuit substrate having an upper surface and a lower surface and electric circuitry provided on at least one surface of the substrate, the method comprising the steps of:
    forming the first circuit substrate by cutting a mother circuit-substrate, said mother circuit substrate having an upper surface and a lower surface and electric circuitry provided on at least one surface of the mother substrate,
    wherein the step of forming the first circuit substrate includes the steps of:
        irradiating a laser beam onto another surface of the mother substrate so that a thermal stress is generated inside the mother substrate using an irradiated spot of the laser beam as a heat source; and
        moving the irradiated spot so as to cut the mother substrate utilizing the thermal stress without forming a scribing line.

5. A method for fabricating a display panel according to claim 4, wherein in the step of cutting the mother substrate, the mother substrate is cut so that the first circuit substrate has a curved corner.

6. A method for fabricating a display panel according to claim 5, wherein in the step of cutting the mother substrate, the mother substrate is cut so that the first circuit substrate has a corner with a radius of curvature of about 2 mm or more.

7. A method for fabricating a display panel according to claim 4, wherein in the step of cutting each of the substrates of the first and the second circuit substrates, the substrates are cut so that each of the first and the second circuit substrates has a curved corner.

8. A method for fabricating a display panel according to claim 5, wherein in the step of cutting each of the substrates of the first and the second circuit substrates, the substrates are cut so that each of the first and the second circuit substrates has a corner with a radius of curvature of about 2 mm or more.

9. A method for fabricating a display panel according to claim 4, further comprising the step of spraying a medium for quenching immediately after the laser beam irradiated spot.

10. A method for fabricating a display panel according to claim 4, further comprising an electrical line arranged discontinuously on a line which is scanned by a laser beam and on a surface which is opposite to a laser irradiated surface.

11. A method for fabricating a display panel having a large circuit substrate obtained by connecting a plurality of first circuit substrates and a second circuit substrate provided so as to face the large circuit substrate, each of the plurality of first circuit substrates and the second circuit substrate having a substrate with an upper surface and a lower surface and electric circuitry provided on at least one surface of the substrate, the method comprising the steps of:
    forming the plurality of first circuit substrates by cutting a mother circuit-substrate having a mother substrate with an upper surface and a lower surface and electric circuitry provided on the at least one surface of the mother substrate;
    forming the large circuit substrate by connecting the cut surfaces of the plurality of first circuit substrates with each other; and
    attaching the large circuit substrate to the second circuit substrate,
    wherein the step of forming the first circuit substrate includes the steps of:
        irradiating a laser beam onto another surface of the mother substrate so that a thermal stress is generated inside the mother substrate using an irradiated spot of the laser beam as a heat source; and
        moving the irradiated spot so as to cut the mother substrate by utilizing the thermal stress without forming a scribing line.

12. A method for fabricating a display panel according to claim 11, further comprising the step of spraying a medium for quenching immediately after the laser beam irradiated spot.

13. A method for fabricating a display panel according to claim 11, further comprising an electrical line arranged discontinuously on a line which is scanned by a laser beam and on a surface which is opposite to a laser irradiated surface.

14. A method for fabricating a display panel including a first circuit substrate and a second circuit substrate, each of the first and the second circuit substrates having a substrate with an upper surface and a lower surface and electric circuitry provided on at least one surface of the substrate, the method comprising the steps of:

attaching the first circuit substrate to the second circuit substrate so that the at least one surface of the first circuit substrate faces the at least one surface of the second circuit substrate;

irradiating a laser beam onto another surface of each of the substrates of the first and the second circuit substrates after the step of attaching the first and the second circuit substrates with each other so that a thermal stress is generated inside the substrate using an irradiated spot of the laser beam as a heat source; and moving the irradiated spot so as to cut each of the substrates of the first and the second circuit substrates by utilizing the thermal stress without forming a scribing line so as to form the display panel.

15. A method for fabricating a display panel according to claim 14, further comprising the step of spraying a medium for quenching immediately after the laser beam irradiated spot.

16. A method for fabricating a display panel having a plurality of subpanels, each of the plurality of subpanels having a first circuit substrate and a second circuit substrate, each of the first and the second circuit substrates having a substrate with an upper surface and a lower surface and electric circuitry provided on at least one surface of the substrate, the method comprising the steps of:

attaching the first circuit substrate to the second circuit substrate so that the at least one surface of the first circuit substrate faces the at least one surface of the second circuit substrate;

irradiating a laser beam onto another surface of each of the substrates of the first and the second circuit substrates after the step of attaching the first and the second circuit substrates with each other so that a thermal stress is generated inside the substrate using an irradiated spot of the laser beam as a heat source;

moving the irradiated spot so as to cut each of the substrates of the first and the second circuit substrates by utilizing the thermal stress without forming a scribing line so as to form at least one of the subpanels; and connecting the cut surfaces of the substrates of the subpanels with each other so as to form the display panel.

17. A method for fabricating a display panel according to claim 16, further comprising the step of spraying a medium for quenching immediately after the laser beam irradiated spot.

18. A method for fabricating a display panel according to claim 16, further comprising an electrical line arranged discontinuously on a line which is scanned by a laser beam and on a surface which is opposite to a laser irradiated surface.

* * * * *